United States Patent [19]
Yabe et al.

[11] Patent Number: 6,154,396
[45] Date of Patent: *Nov. 28, 2000

[54] SEMICONDUCTOR MEMORY DEVICE HAVING A DELAY CIRCUIT SET ACCORDING TO THE STORAGE CAPACITY OF A MEMORY MACRO

[75] Inventors: Tomoaki Yabe, Mito; Shinji Miyano, Yokohama, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/443,283

[22] Filed: Nov. 19, 1999

[51] Int. Cl.⁷ ........................................................ G11C 7/10
[52] U.S. Cl. ................ 365/194; 365/189.05; 365/189.08; 365/233; 365/233.5; 365/230.03; 365/63; 365/226
[58] Field of Search .................................. 365/194, 230.3, 365/189.05, 233, 63, 226, 233.5, 189.08

[56] References Cited

U.S. PATENT DOCUMENTS 5,698,876  12/1997  Yabe et al. ................................ 257/296
5,881,008   3/1999  Becker ..................................... 365/210

FOREIGN PATENT DOCUMENTS 5-6654  1/1993  Japan ............................ G11C 11/401

OTHER PUBLICATIONS

Yabe et al., "A Configurable DRAM Macro Design for 2112 Derivative Organizations to be Synthesized Using a Memory Generator", ISSCC 98, Feb. 5, 1998, pp. 72–73, 415.

IEEE Journal of Solid–State Circuits, vol. 33, No. 11, Nov. 1998; "A Configurable DRAM Macro Design for 2112 Derivative Organizations to be Synthesized Using a Memory Generator", Tomoaki Yabe, et al., pp. 1752–1757.

*Primary Examiner*—Andrew Q. Tran
*Attorney, Agent, or Firm*—Banner & Witcoff, Ltd.

[57] ABSTRACT

A delay circuit that delays a signal for controlling data read/write is composed of inverters, capacitors, and switches. The delay time that the delay circuit provides is set by selectively changing over the switches according to the storage capacity of a memory macro. Thus, the delay time most suitable for the storage capacity of the memory macro can be set, which allows the data read/write operation to be speeded up.

40 Claims, 21 Drawing Sheets

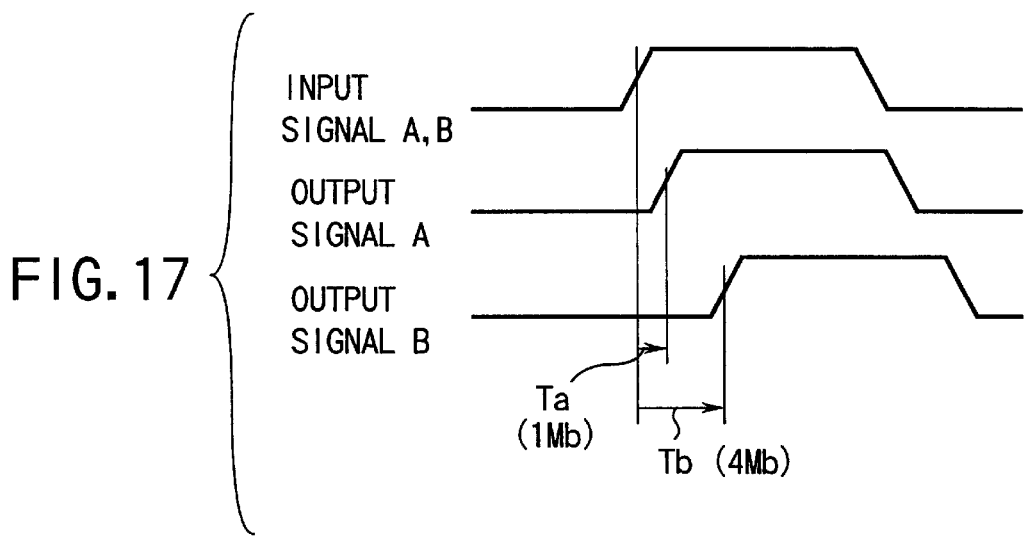
FIG. 17
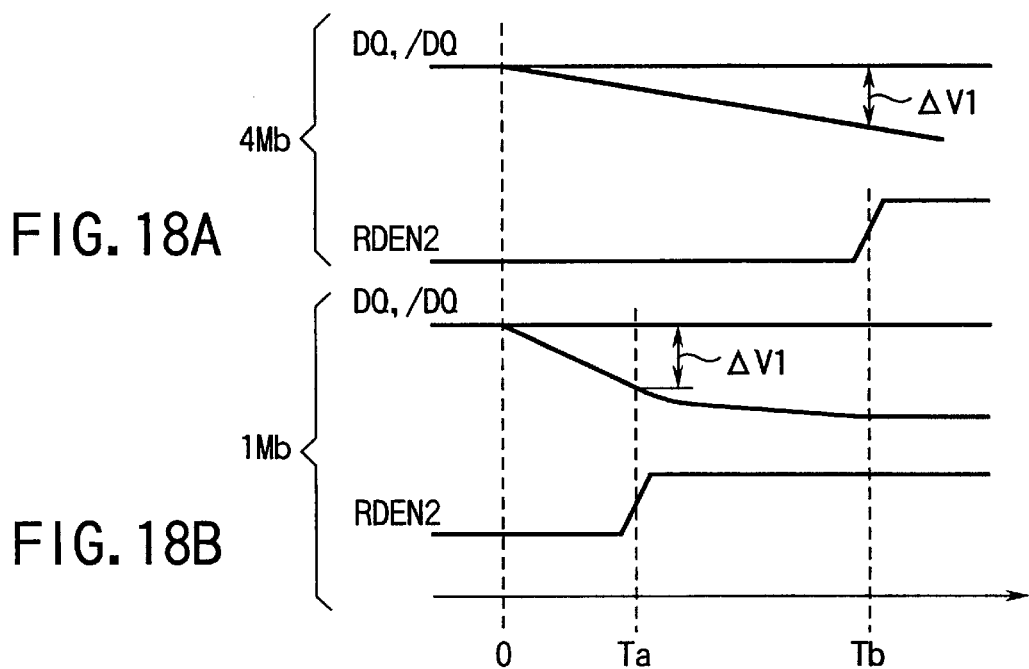
FIG. 18A
FIG. 18B

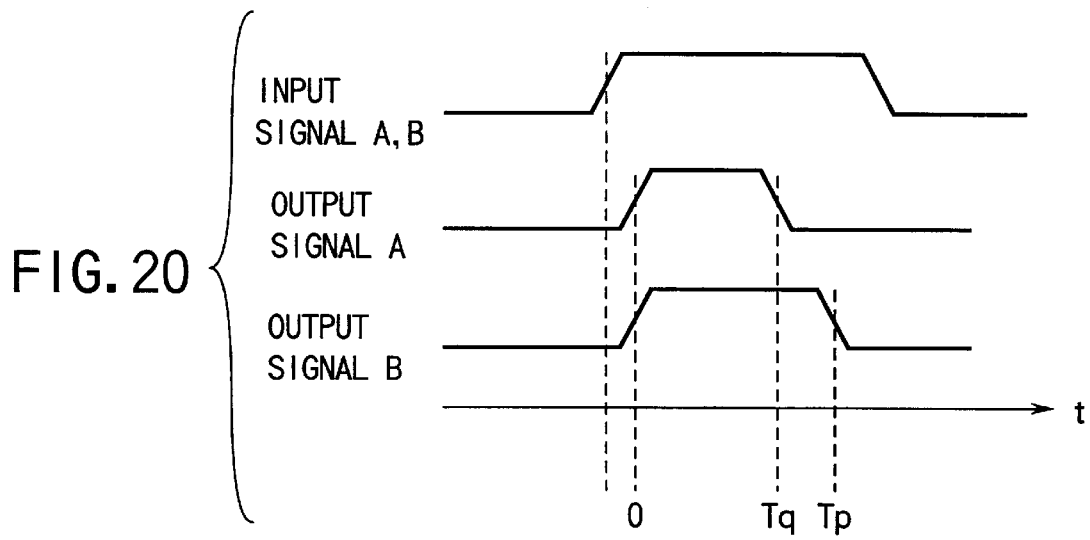
FIG. 20
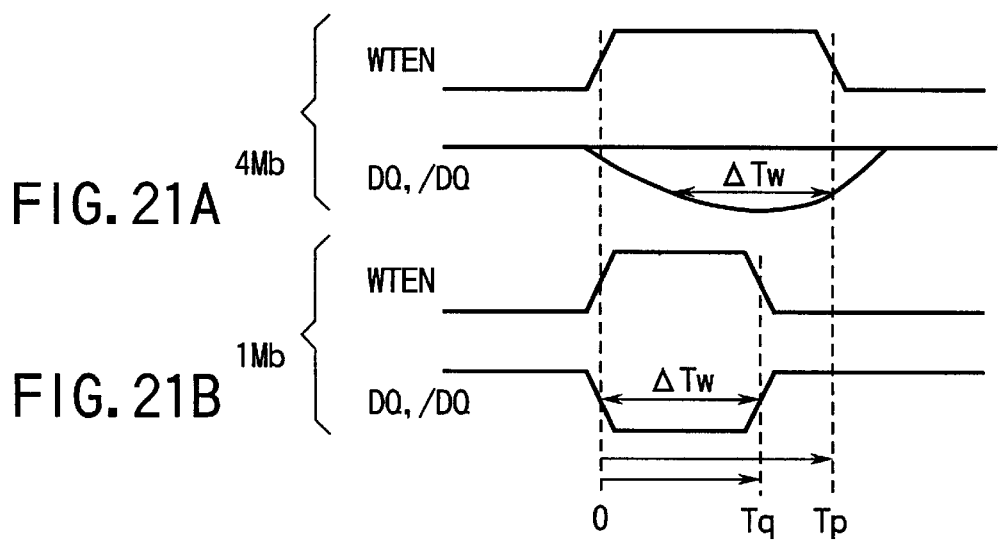
FIG. 21A 4Mb
FIG. 21B 1Mb

SEMICONDUCTOR MEMORY DEVICE HAVING A DELAY CIRCUIT SET ACCORDING TO THE STORAGE CAPACITY OF A MEMORY MACRO

BACKGROUND OF THE INVENTION

The present invention relates to a memory macro cell which is merged with, for example, a logic unit.

This application is based on Japanese Patent Application No. 10-330802, filed Nov. 20, 1998, the content of which is incorporated herein by reference.

FIG. 31 shows the configuration of a DRAM that is merged with a logic unit. On a semiconductor chip 10 is placed a logic circuit unit 11 that consists of a gate array or standard cells. In the center of the logic circuit unit 11, a memory macro 12 is placed which consists of macro cells by way of example. Further, an I/O unit 13, including input/output pads, is placed on the periphery of the chip 10. For example, a phase locked loop (PLL) circuit may be placed in the logic circuit unit 11.

When a memory macro having a large capacity of more than 1 Mbits is formed of a DRAM, it is difficult to use an automatic design technique to generate automatically a DRAM array of an arbitrary number of row and columns because the DRAM operational margin depends greatly upon capacitances associated with bit and word lines. For such a DRAM macro cell (hereinafter referred to as a DRAM macro), a technique has generally been used which arranges parts, such as memory arrays, which have been designed manually in advance contiguously by the number that satisfies a desired storage capacity.

The DRAM macro has a memory cell array and a pair of data lines (hereinafter referred to as a paired DQ line or paired DQ lines). The paired DQ line is used to transfer read data from the memory cell array to an input/output buffer and to transfer write data from the input/output buffer to a memory cell selected in the memory cell array. The larger the storage capacity of the DRAM macro, the longer the paired DQ line is. Thus, as the storage capacity of the DRAM macro increases, the delay time suffered by a data signal that is transmitted over the paired DQ line increases. At data read time, therefore, the time required for data read from a selected memory cell to be transferred over the paired DQ line to the input/output data buffer and then latched in that buffer also depends on the length of the paired DQ line. To prevent erroneous data latching, therefore, the input/output buffer has its latch timing delayed so as not to latch data from when data readout is started until the signal amplitude on the paired DQ line reaches a predetermined potential.

However, with the conventional DRAM macro, the delay time associated with the latch timing is fixed to suit the maximum storage capacity of the memory macro. For this reason, a unnecessarily long delay time has been set for a memory macro having a small storage capacity. Thus, such a DRAM macro as has a small storage capacity has a problem that the time required to read data becomes unnecessarily long.

The same problem arises at data write time. That is, at data write time, write data is transferred from the input/output buffer to the paired DQ line, then transferred from the paired DQ line to bit lines and written into a selected memory cell. Since a memory macro of large storage capacity has a large capacitance associated with paired DQ lines, a write pulse is rounded while data is being transferred over the paired DQ line, which makes the effective pulse width narrower. In view of this, in a memory macro of large storage capacity it is required to make the width of a write pulse larger than in the memory macro of small storage capacity.

However, the delay time introduced by a delay circuit that defines the write pulse width has conventionally been set long to provide for a memory macro of large storage capacity, which causes a problem in the case of a memory macro of small storage capacity in that the data write time becomes unnecessarily long.

Thus, since the conventional DRAM macro has its timing of reading/writing data fixed to provide for the implementation of a memory macro of large storage capacity, a problem arises in implementation of a memory macro of small storage capacity in that the data read/write time becomes unnecessarily long.

BRIEF SUMMARY OF THE INVENTION

It is therefore an object of the present invention to provide a semiconductor memory device which permits the data read/write time to be reduced even in implementation of a memory macro of small storage capacity by setting the most suitable delay time according to the storage capacity of the memory macro.

According to an aspect of the present invention there is provided a semiconductor memory device comprising: a memory macro section having at least one memory array block in which a plurality of memory cells are arranged in rows and columns; a data buffer block for holding input/output data; paired data lines connected between the memory array block and the data buffer block for transferring a signal between a selected memory cell and the data buffer block; a latch circuit provided in the data buffer block for latching a signal on the paired data lines; and a timing adjust circuit for adjusting the timing of activating the latch circuit according to the storage capacity of the memory macro.

According to another aspect of the present invention there is provided a semiconductor memory device comprising: a memory macro section having at least one memory array block in which a plurality of memory cells are arranged in rows and columns; a data buffer block for holding input/output data; paired data lines connected between the memory array block and the data buffer block for transferring a signal between a selected memory cell and the data buffer block; a data write circuit for supplying a write signal to the paired data lines; and a timing adjust circuit for adjusting the pulse width of the write signal from the data write circuit according to the storage capacity of the memory macro.

According a further aspect of the present invention there is provided a semiconductor memory device comprising: at least one memory cell array block in which a plurality of memory cells are arranged in rows and columns; a sense amplifier block for detecting data read from the memory cells in the memory cell array block; a column select block placed to correspond to the sense amplifier block for making a selection from the columns; a data buffer block for holding input/output data; paired data lines connected between the sense amplifier block and the data buffer block for transferring a signal between a selected sense amplifier and the data buffer block; and a timing adjust circuit provided to correspond to the memory array block and including a delay element that provides the same delay time as the column select circuit so that the delay of a signal passing through the delay element and the delay of a signal transferred over the paired DQ lines match.

According to the present invention, the most suitable delay time for signal transmission can be set according to the storage capacity of the memory macro. Therefore, the data read/write time can be reduced even in implementation of a memory macro of small storage capacity. In addition, the time required to design a memory macro can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 17 shows operating waveforms in the circuit of FIGS. 16A and 16B;

FIGS. 18A and 18B show operating waveforms in the circuit of FIGS. 16A and 16B;

FIG. 20 shows operating waveforms in the circuit of FIGS. 19A and 19B;

FIGS. 21A and 21B show operating waveforms in the circuit of FIGS. 19A and 19B;

DETAILED DESCRIPTION OF THE INVENTION

Figure 1:
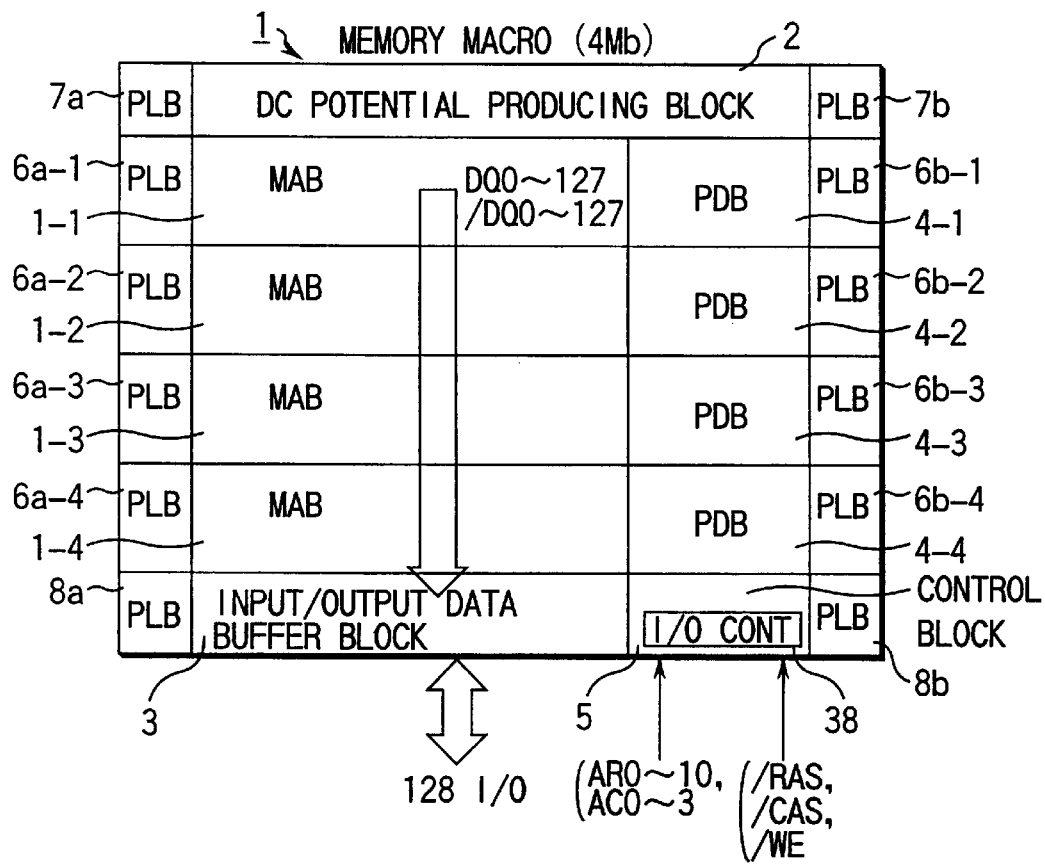
FIG. 1 shows a configuration of a 4-Mbit DRAM macro to which the present invention is applied.
Figure 31:
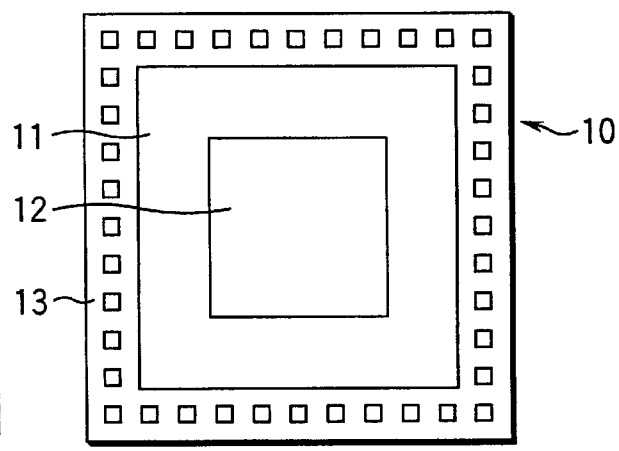
FIG. 31 shows a normal DRAM merged with a logic unit.

Referring now to FIG. 1, there is illustrated an example of a DRAM macro to which the present invention is applied. This example is a memory macro of 4 Mbits=2048 rows×16 columns×128 I/O. This macro is designed independently of the logic unit 11 shown in FIG. 31. That is, the memory macro 1 is composed of memory array blocks (MAB) 1-1, 1-2, . . . 1-4, a DC potential producing block 2, an input/output data buffer block 3, memory array power driver blocks (PDB) 4-1, 4-2, . . . 4-4, a control block 5, and power line blocks (PLB) 6a-1, 6a-2, . . . 6a-4, 6b-1, 6b-2, . . . 6b-4, 7a, 7b, 8a, and 8b.

The memory array blocks 1-1, 1-2, 1-3, and 1-4 are arranged contiguously in the column direction (i.e., in the direction of bit lines not shown). For example, 128 paired DQ lines (DQ0 to DQ127 and /DQ0 to /DQ127, /-indicating complement) that extend in the column direction are associated with the memory array blocks 1-1, 1-2, 1-3, and 1-4. The corresponding ones of the paired DQ lines on the respective memory array blocks are joined together by arranging the memory array blocks contiguously.

The DC potential producing block 2, as will be described later in detail, provides fixed potentials including a substrate potential VBB, a word line potential VPP, a bit line potential VBL, a reference potential VPPA for a sense amplifier power driver, and a supply potential VINT for peripheral circuits. The DC potential producing block 2 is placed adjacent to the memory array block 1-1.

The input/output data buffer block 3 is placed adjacent to the memory array block 1-4. The paired DQ lines of the memory array blocks 1-1, 1-2, 1-3, and 1-4 are connected to the input/output data buffer block 3.

The memory array power driver blocks (PDB) 4-1, 4-2, 4-3 and 4-4 are placed adjacent to the memory array blocks 1-1, 1-2, 1-3 and 1-4, respectively, and include circuits for providing electric power to drivers for driving sense amplifiers.

The control block 5, as will be described later in detail, includes buffers connected to receive a row address strobe signal /RAS, a column address strobe signal /CAS, and a write enable signal /WE, respectively, buffers connected to receive row address signal bits (external address signal bits) AR0 to AR10 and column address signal bits (external column address signal bits) AC0 to AC3, respectively, to provide an internal row address signal and an internal column address signal, switches for fixing part of the internal row address signal bits (block selection address signal bits) at a fixed potential according to the storage capacity of the memory macro (i.e., the number of the memory array blocks), and an input/output data buffer control circuit (I/O CONT) 38 for controlling the input/output data buffer block.

The power line blocks (PLB) 6a-1, 6a-2, 6a-4, 6b-1, 6b-2, 6b-4, 7a, 7b, 8a, and 8b provide an external supply voltage VEXT and ground potential GND (not shown) to the memory array blocks 1-1, 1-2, . . . 1-4, the DC potential producing block 2, the input/output data buffer block 3, the memory array power driver blocks (PDB) 4-1, 4-2, . . . 4-4, and the control block 5.

Figure 2:
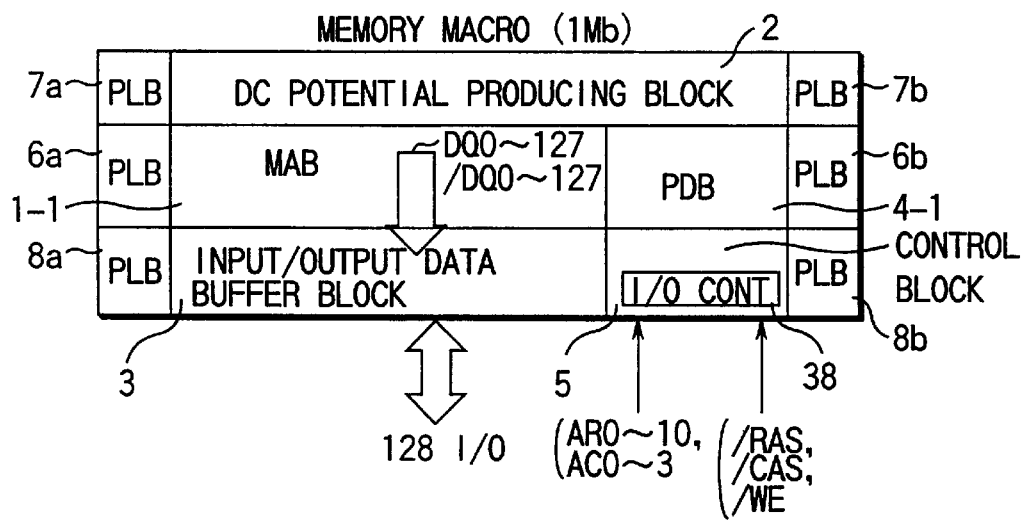
FIG. 2 shows a configuration of a 1-Mbit DRAM macro to which the present invention is applied.

FIG. 2 shows the configuration of a DRAM macro having a storage capacity of 1 Mbits, like reference numerals and characters being used to designate corresponding components to those in FIG. 1. In this example, a DRAM macro of storage capacity 1 Mbits is implemented by using the 1-Mbit memory array block 1-1 only. Thus, the numbers of the memory array power driver blocks (PDB) and the power line blocks (PLB) are reduced according to the number of the memory array blocks used. The length of the paired DQ lines is made shorter than in the case of FIG. 1 because the memory address block is one in number.

Figure 3:
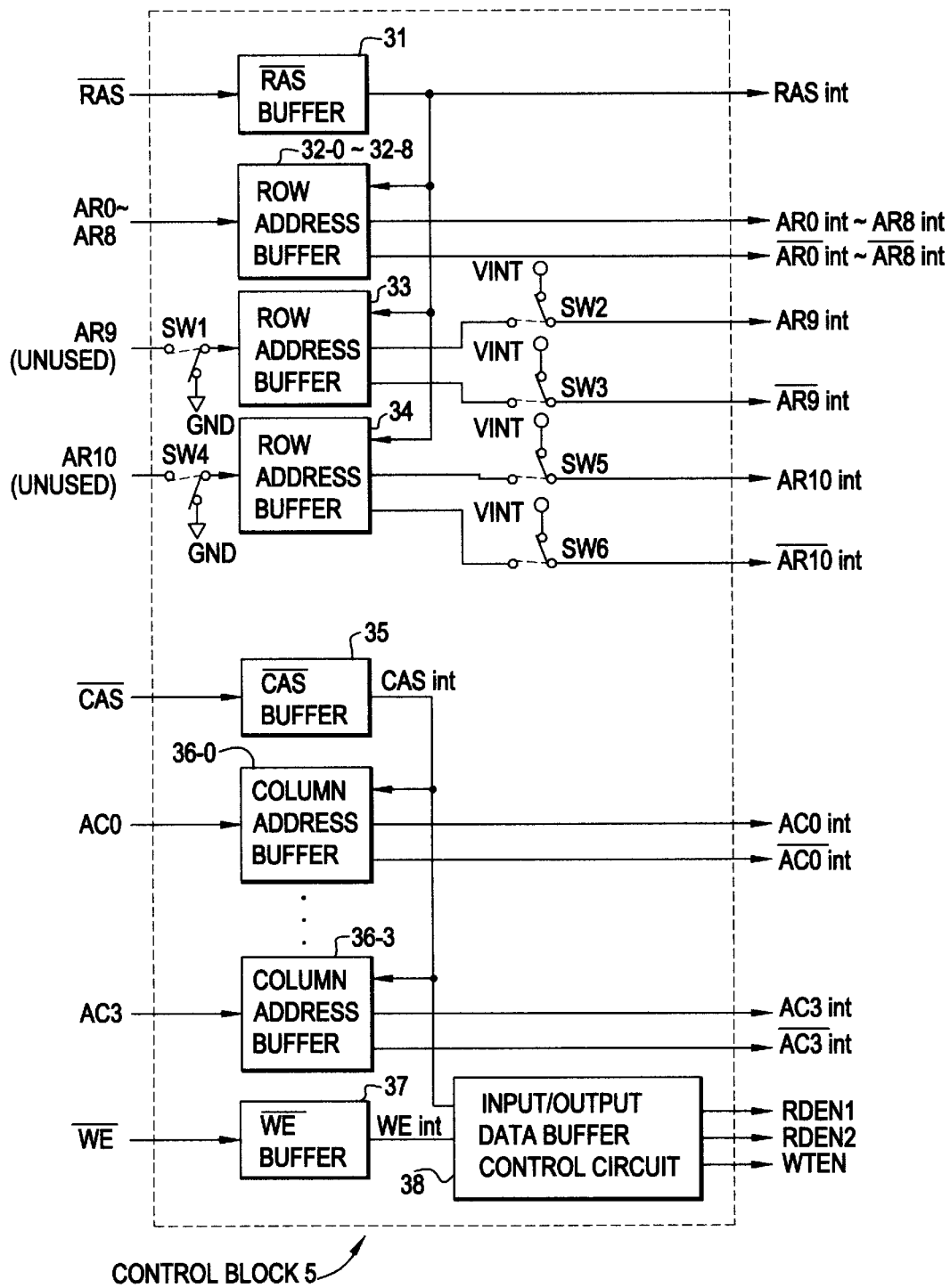
FIG. 3 is a block diagram of the control block shown in FIGS. 1 and 2.

FIG. 3 shows the configuration of the control block 5 shown in FIGS. 1 and 2. The control block includes a /RAS buffer 35, row address buffers 32-0 to 32-8, 33 and 34, a /CAS buffer 35, column address buffers 36-0 to 36-3, a /WE buffer 37, and an input/output data buffer control circuit 38.

The /RAS buffer 31 receives an externally applied row address strobe signal /RAS to produce a row address strobe signal RASint that is used inside the memory macro.

The row address buffers 32-0 to 32-8 receive externally applied row address signal bits AR0 to AR8 to produce internal row address signal bits AR0int to AR8int and /AR0int to /AR8int in synchronism with the row address strobe signal RASint, which are then applied to a row decoder to make a selection among 512 rows in a selected memory array block.

The row address buffers 33 and 34 receive externally applied row address signal bits AR9 and AR10 to produce internal row address signal bits AR9int, AR10int, /AR9int and /AR10int in synchronism with the row address strobe signal RASint, which are used to make a selection among four memory array blocks. When the row address signal bits AR9 and AR10 are received to produce the internal row address signal bits AR9int, AR10int, /AR9int, and /AR10int, switches SW1 and SW4 connected to the inputs of the row address buffers 33 and 34 and switches SW2, SW3, SW5 and SW6 connected to the outputs of the row address buffers 33 and 34 are each connected as indicated by a dashed line.

The number of bits of a row address signal to make a selection from the memory array blocks varies with the number of the memory array blocks in the memory macro. More specifically, the number, M, of the memory array blocks in the memory macro and the number, m, of bits of a block selection row address signal are related by $M \leq 2^m$.

Since this embodiment can include up to four memory array blocks, two block selection row address signal bits, AR9 and R10, are used. When only one memory array block is used as shown in FIG. 2, the block selection address signal bits AR9 and AR10 are not used but fixed at a given potential, for example, ground potential GND. In this case, the switches SW1 and SW4 connected to the inputs of the row address buffers 33 and 34 are each connected as indicated by solid line and the switches SW2, SW3, SW5 and SW6 are each connected as indicated by a dotted line.

When the maximum number of memory array blocks is used (when the storage capacity of the memory macro is maximized), the switches SW1 to SW6 connected to the row address buffers 33 and 34 are changed over as indicated by solid lines. Setting the switches in this manner allows all the block selection row address signal bits to be used.

When two memory array blocks are used, one block selection row address signal bit, say, AR9, is used to produce the internal row address signal bits AR9int and /AR9int and the other block selection address signal bit AR10 is cut off. In this case, the switches SW5 and SW6 are changed over so that the internal row address signal bits AR10int and /AR10int are fixed at a given potential, for example, the supply potential VINT.

When only one of the four memory array blocks is used, the switches SW1 and SW4 are placed to the GND position to cut off all the block selection row address signal bits AR9 and AR10 and moreover one of the switches SW2, SW3, SW5 and SW6 is set to the VINT position to fix all the internal row address signal bits AR9int, /AR9int, AR10int and /AR10int at the supply potential VINT. Each of the switches can be physically implemented by selectively forming a metal layer or a contact layer.

The switches SW1 to SW6 may be ones that can be electrically changed over but in practice they are switched by means of CAD processing at memory macro design time only. Thus, the switching becomes impossible after the production of products or samples. That is, if the storage capacity of the memory macro (the number of the memory array blocks) is determined at memory macro design time, then the connection relationship of the switches SW1 to SW6 will also be determined.

FIGS. 4A to 4D show examples of the switches SW1 to SW6. These switches are formed by placing a metal layer 80a or contact layer 80b.

Figure 4A:
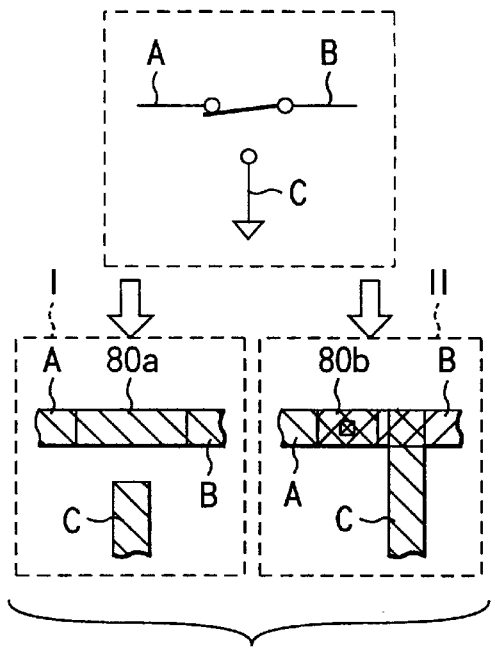
FIGS. 4A to 4D show configurations of the switches shown in FIG. 3.
Figure 4B:
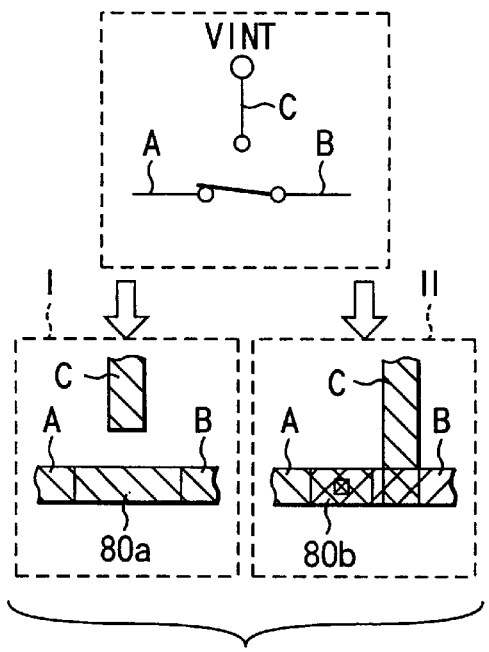
Figure 4C:
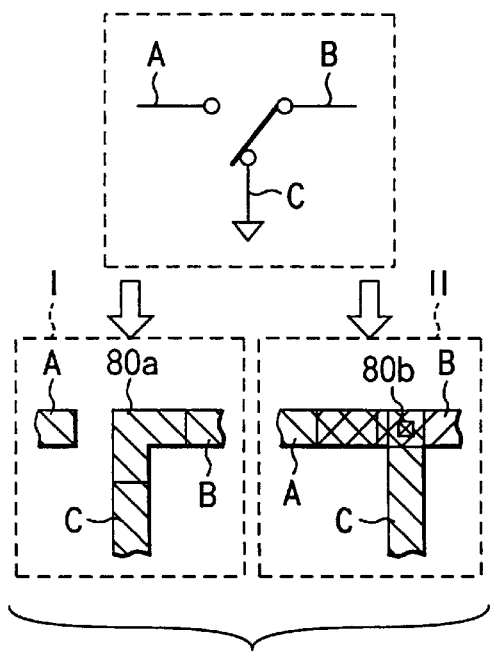
Figure 4D:
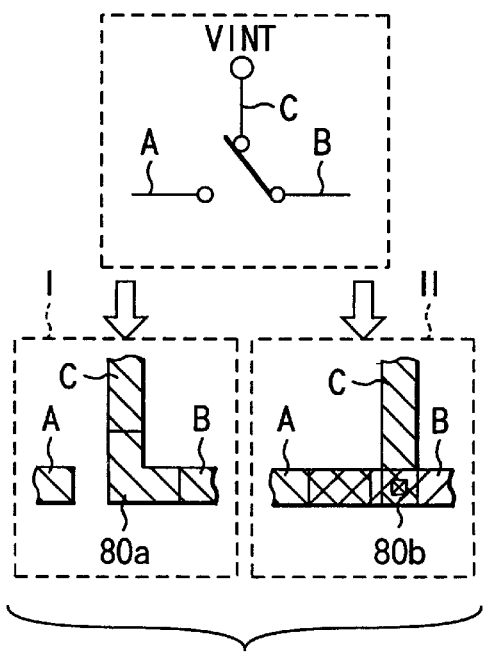

For example, to connect lines A and B together which are coplanar with each other, a metal layer 80a to connect the lines is produced by means of CAD as shown in boxes I in FIGS. 4A and 4B. Likewise, to connect a line B and a power line forming line C which are coplanar with each other, a metal layer 80a to connect these lines is produced by means of CAD as shown in box I in FIGS. 4C and 4D.

In contrast, when lines A and B are not coplanar with each other, or when these lines are formed at different levels in multilayered interconnection structure, a contact layer 80b that connect the lines A and B together is produced by means of CAD as shown in box H in FIGS. 4A and 4B. In addition, to connect a line B in multilayered interconnection structure and a line C as a power line, a contact layer 80b that connect the lines A and C together is produced by means of CAD as shown in box II in FIGS. 4C and 4D.

After the formation of the metal layer 80a or contact layer 80b by actual wafer processing, it is impossible to change the state of the switches SW1 to SW6.

These switches SW1 to SW6 are provided to facilitate the design of the memory macro. That is, by changing the interconnection relationships within the previously designed control block 5 as shown in FIGS. 4A to 4D, a control block that conforms to memory macro specifications can be obtained. Thus, such a configuration advantageously eliminates the need of redesigning the control block each time changes are made to the memory macro specifications (the number of rows, the number of columns, the number of I/O lines, the storage capacity, etc.).

Figure 5:
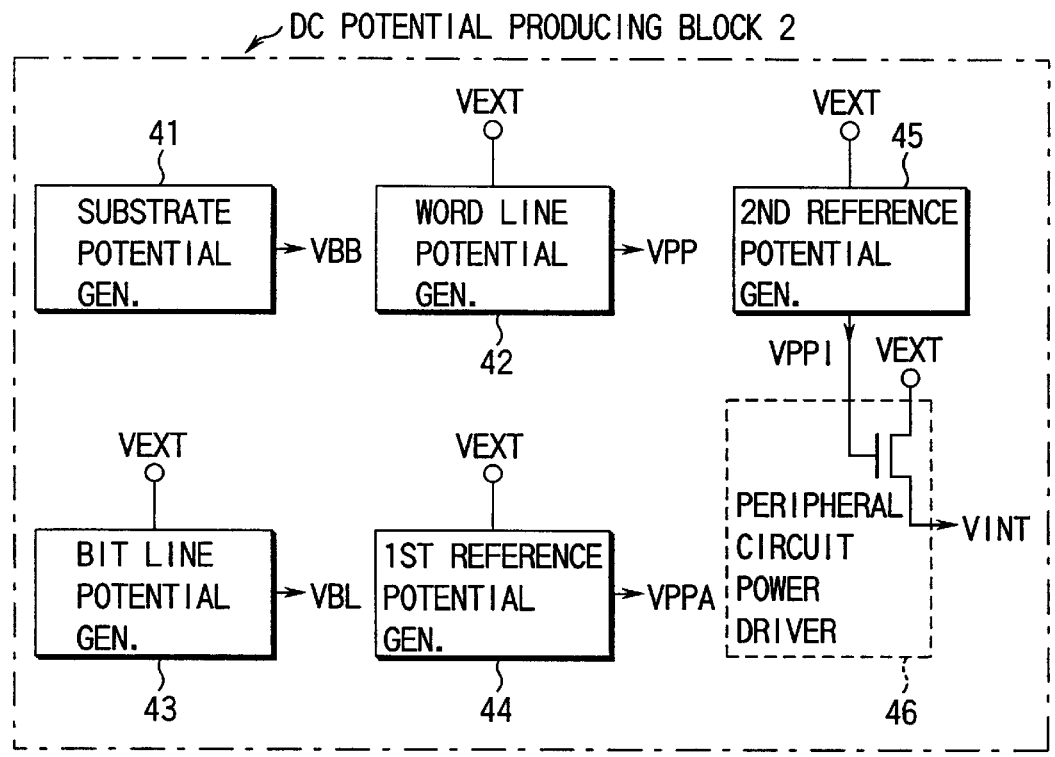
FIG. 5 shows an arrangement of the DC potential producing block shown in FIGS. 1 and 2.

FIG. 5 shows the circuit arrangement of the DC potential producing block 2 shown in FIGS. 1 and 2.

A substrate potential generating circuit 41 generates a substrate potential VBB in the memory macro. A word line potential generating circuit 42 generates a potential VPP to be applied to a word line selected by a row address signal. A bit line potential generating circuit 43 is provided to equalize the potential of paired bit lines to a given value before read data or write data is transferred to the paired bit lines.

A first reference potential generating circuit 44, which is a potential generating circuit for a sense amplifier power driver, generates a supply voltage VPPA in response to an external supply voltage VEXT. A second reference potential generating circuit 45 generates a supply voltage VPPI in response to the external supply voltage VEXT.

A peripheral circuit power driver 46 comprises a MOS transistor which is supplied at its drain with the external supply voltage VEXT. The MOS transistor has its gate supplied with the supply voltage VPPI from the second reference potential generating circuit 45 and outputs at its source an internal supply voltage VINT for driving the peripheral circuit in the memory macro.

Figure 6:
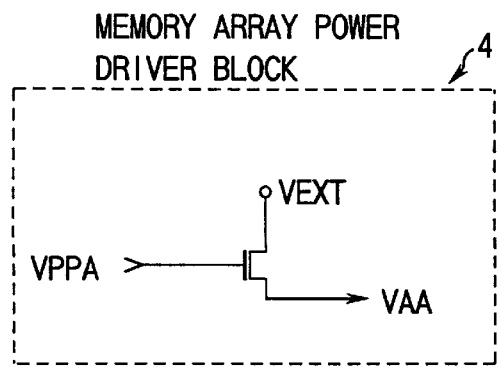
FIG. 6 shows an arrangement of the memory array power driver block shown in FIGS. 1 and 2.

FIG. 6 shows the circuit arrangement of the memory array power driver blocks 4, each of which comprises a MOS transistor. The MOS transistor has its drain supplied with the external supply voltage VEXT and its gate supplied with the supply voltage VPPA from the first reference potential generating circuit 44, thereby outputting an internal supply voltage VAA at its source.

Figure 7:
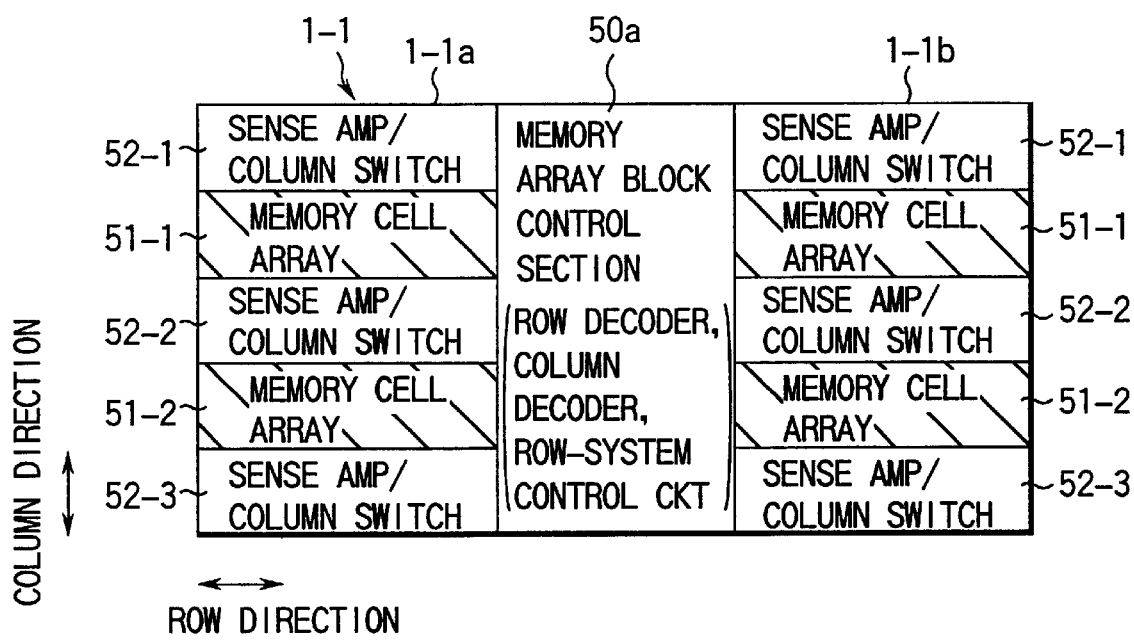
FIG. 7 shows a configuration of the 1-Mbit memory array block shown in FIGS. 1 and 2.

FIG. 7 shows the arrangement of the 1-Mb memory array block 1-1. A memory array block control section 50*a* includes a row decoder, a column decoder, a row-system control circuit, etc. Two memory cell arrays 51-1 and 51-2 are placed adjacent to each of opposite ends of the memory array block control section 50*a* in the row direction. That is, each of memory array blocks 1-1*a* and 1-1*b* opposite to each other with the memory array block control section 50*a* interposed therebetween includes the memory cell arrays 51-1 and 51-2.

In the memory array block 1-1*a*, adjacent to opposite ends of the memory cell array in the column direction are placed sense amplifier/column switch sections 52-1 and 52-2 including sense amplifiers for amplifying the potential on the bit lines not shown and column switches for connecting the paired DQ lines and the sense amplifiers. Further, a sense amplifier/column switch section 52-3 is placed to be opposed to the sense amplifier/column switch section 52-2 with the memory cell array 51-2 interposed therebetween. Likewise, in the memory array block 1-1*b*, sense amplifier/column switch sections 52-1 and 52-2 are placed on the opposite sides of the memory cell array 51-1 in the column direction. Further, a sense amplifier/column switch section 52-3 is placed to be opposed to the sense amplifier/column switch section 52-2 with the memory cell array 51-2 interposed therebetween.

Figure 8:
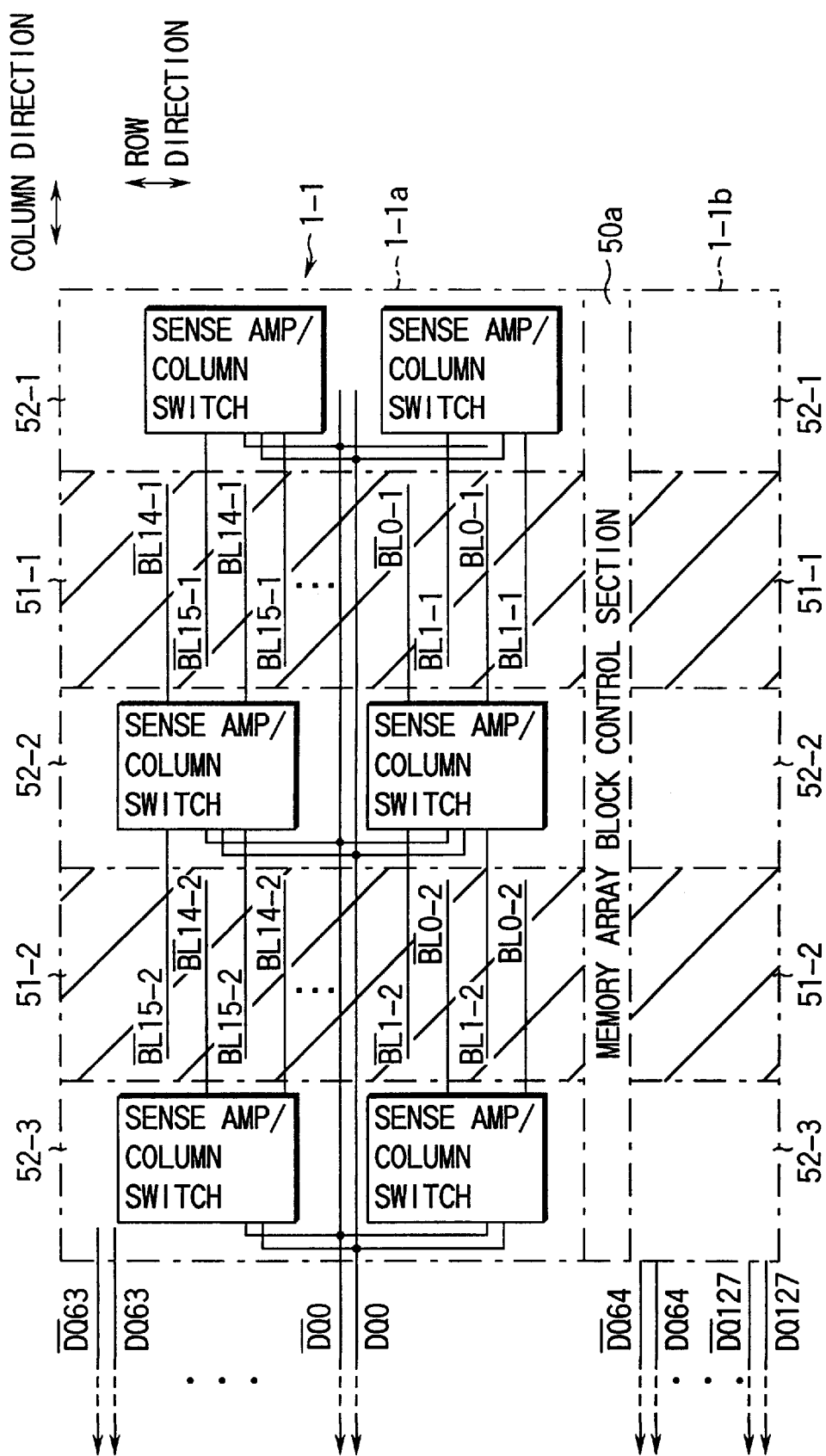
FIG. 8 is a more detailed diagram of the memory array block shown in FIG. 7.

FIG. 8 shows the layout of the memory array block 1-1 shown in FIG. 7. In this example, since the storage capacity of the memory array block is 1 bits, the storage capacity of each of the memory cell arrays 51-1 and 51-2 is 256 Kbits and each memory cell array is composed of, for example, 256 rows and 1024 columns.

The paired DQ lines DQ0 to DQ63 and /DQ0 to /DQ63 are placed over the memory cell arrays 51-1 and 51-2 on one side of the memory cell array block control section 50*a* and the paired DQ lines DQ64 to DQ127 and /DQ64 to /DQ127 are placed over the memory cell arrays 51-1 and 51-2 on the other side of the memory cell array block control section 50*a*.

Paired bit lines for 16 columns are connected to each paired DQ line. Data transmission is allowed between a paired DQ line and a paired bit line for one column selected by a column select signal from paired bit lines for 16 columns. Thus, the number of bits that can be input or output concurrently (the number of I/O lines) is 128 (128 I/O lines). In each memory array block, the memory cell arrays share the sense amplifier/column switch section interposed therebetween.

Figure 9:
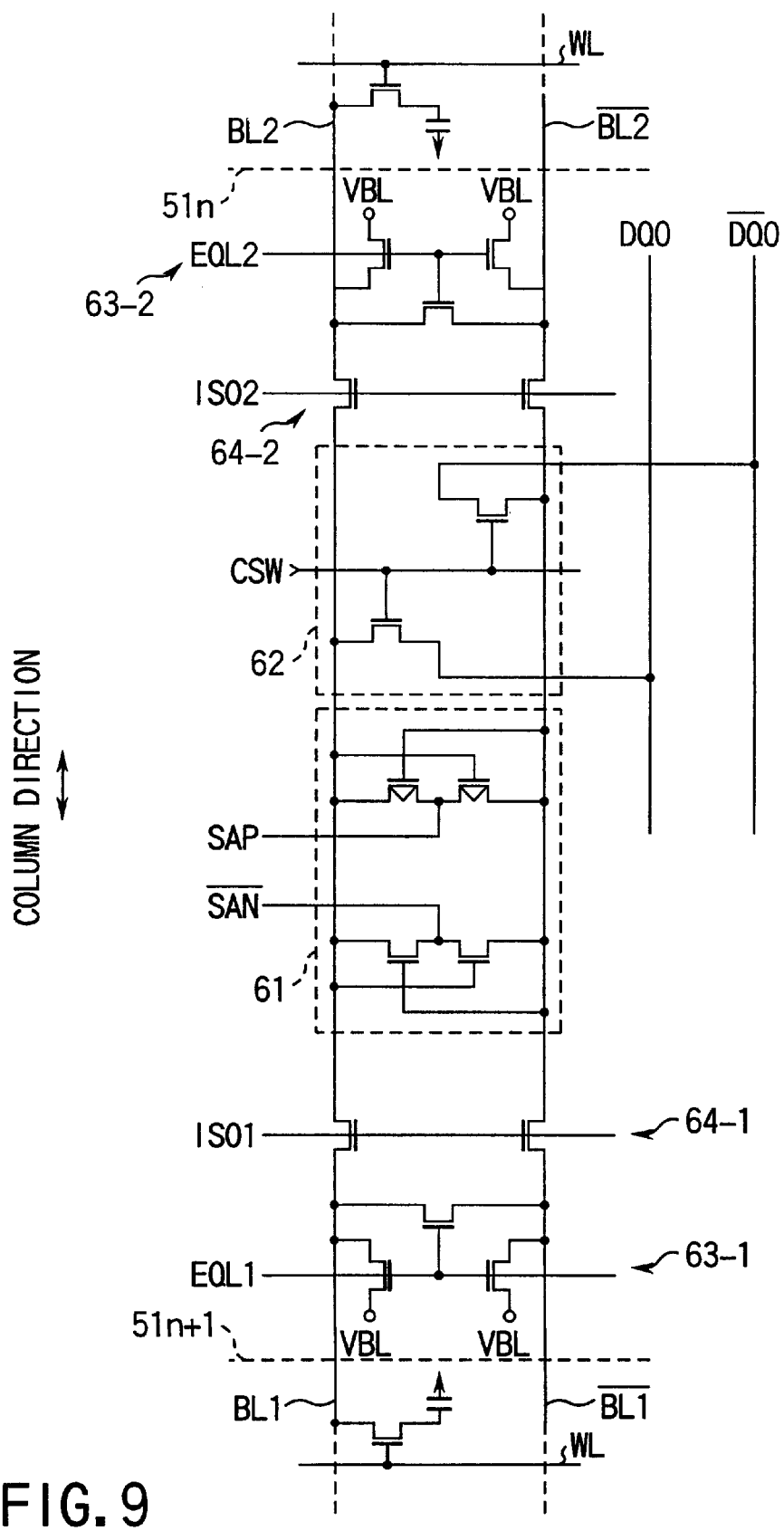
FIG. 9 shows a circuit arrangement of the sense amplifier/column switch.

FIG. 9 shows the circuit arrangement of a sense amplifier/column switch. Between two memory cell arrays 51*n* and 51*n*+1 opposite to each other in the column direction are placed a sense amplifier 61 and a column switch 62. The sense amplifier 61 is activated by activation signals SAP and /SAN and the column switch 62 is activated by a column select signal CSW.

Paired bit lines BL1 and /BL1 extending toward the memory cell array 51*n*+1 are connected to the sense amplifier 61 and the column switch 62 through a bit-line equalizer 63-1 and a select gate 64-1. Paired bit lines BL2 and /BL2 extending toward the memory cell array 51*n* are connected to the sense amplifier 61 and the column switch 62 through a bit-line equalizer 63-2 and a select gate 64-2.

The select gate 64-1 is activated by a select signal IOS1, while the select gate 64-2 is activated by a select signal ISO2. Either of the select gates 64-1 and 64-2 is activated, so that the paired bit lines BL1 and /BL1 or BL2 and /BL2 are electrically connected to the sense amplifier 61 and the column switch 62.

Figure 10:
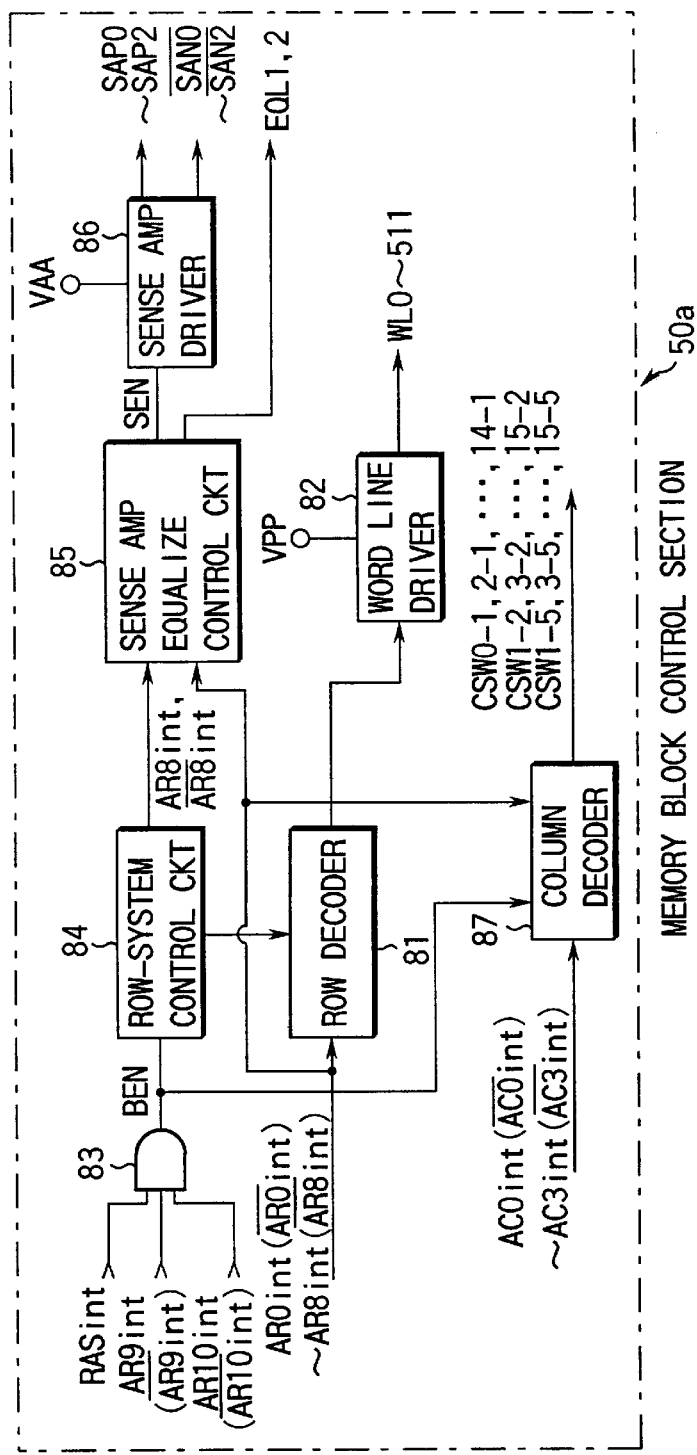
FIG. 10 is a block diagram of the memory array block control section.

FIG. 10 shows the arrangement of the memory array block control section 50*a*, which produces bit-line equalization signals EQL1 and EQL2 shown in FIG. 9, sense amplifier activation signals /SAN0 to /SAN2 and SAP0 to SAP2, a column select signal CSW, and cell array select signals ISO1 and ISO2.

The 1-Mb memory array block comprises, for example, 512 rows and 1024 columns. Thus, the word lines in the memory array block are selected by nine low-order bits AR0int to AR8int and /AR0int to /AR8int of a row address signal.

A row decoder 81 receives the nine low-order bits AR0int to AR8int and /AR0int to /AR8int of an internal row address signal from the control block 5 and applies its output to a word line driver 82. The word line driver 82 applies a given potential to a word line selected by AR0int to AR8int and /AR0int to /AR8int of the internal row address signal.

The two high-order bits AR9int and AR10int and /AR9int and /AR10int of the row address signal are used to select one block when the memory macro is constructed from a plurality of memory array blocks.

The AR9int and AR10int and /AR9int and /AR10int of the block selection internal row address signal are applied to an AND circuit 83 along with an internal row address strobe signal RASint. This AND circuit produces a memory array block activation signal BEN which activates a row-system control circuit 84.

The output of the row-system control circuit 84 is connected to a sense amplifier/equalizer control circuit 85, which produces equalizer control signals EQL1 and EQL2 to determine the timing of equalizing the paired bit line and applies a sense amplifier control signal SEN to a sense amplifier driver 86. The sense amplifier driver produces sense amplifier activation control signals SAP0 to SAP2 and /SAN0 to /SAN2 to determine the timing of activating the sense amplifiers.

The column decoder 87, which is connected to receive the memory array block activation signal BEN indicating whether to select a block, the AR0int to AR8int and /AR0int to /AR8int of an internal row address signal, and AC0int to AC3int and /AC0int to /AC3int of an internal column address signal, controls the activation of column select signals CSW0-1, 2-1, . . . 14-1, CSW1-2, 3-2, . . . 15-2, CSW1-5, 3-5, . . . 15-5.

Figure 11:
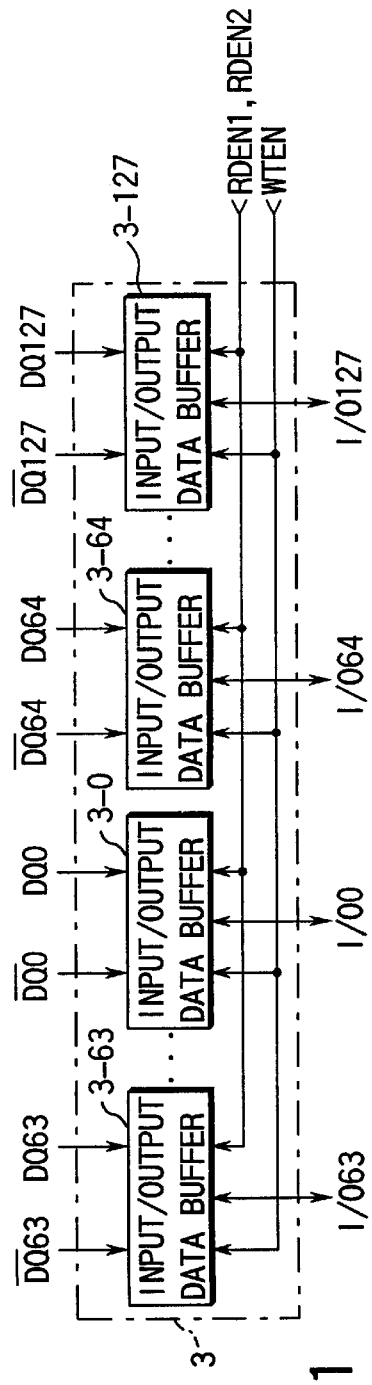
FIG. 11 shows an arrangement of the input/output data buffer block.

FIG. 11 shows the arrangement of the input/output data buffer block 3. This input/output data buffer block is composed of 128 input/output data buffers 3-0 to 3-127.

In the case of an arrangement that enables 128 bits (I/O0 to I/O127) of input/output data to be read or written concurrently, 128 input/output data buffers are naturally required. Each of the input/output data buffers 3-0 to 3-127 is controlled by read activation signals RDEN1 and RDEN2 that are activated at data read time and a write activation signal WTEN that is activated at data write time.

Figure 12:
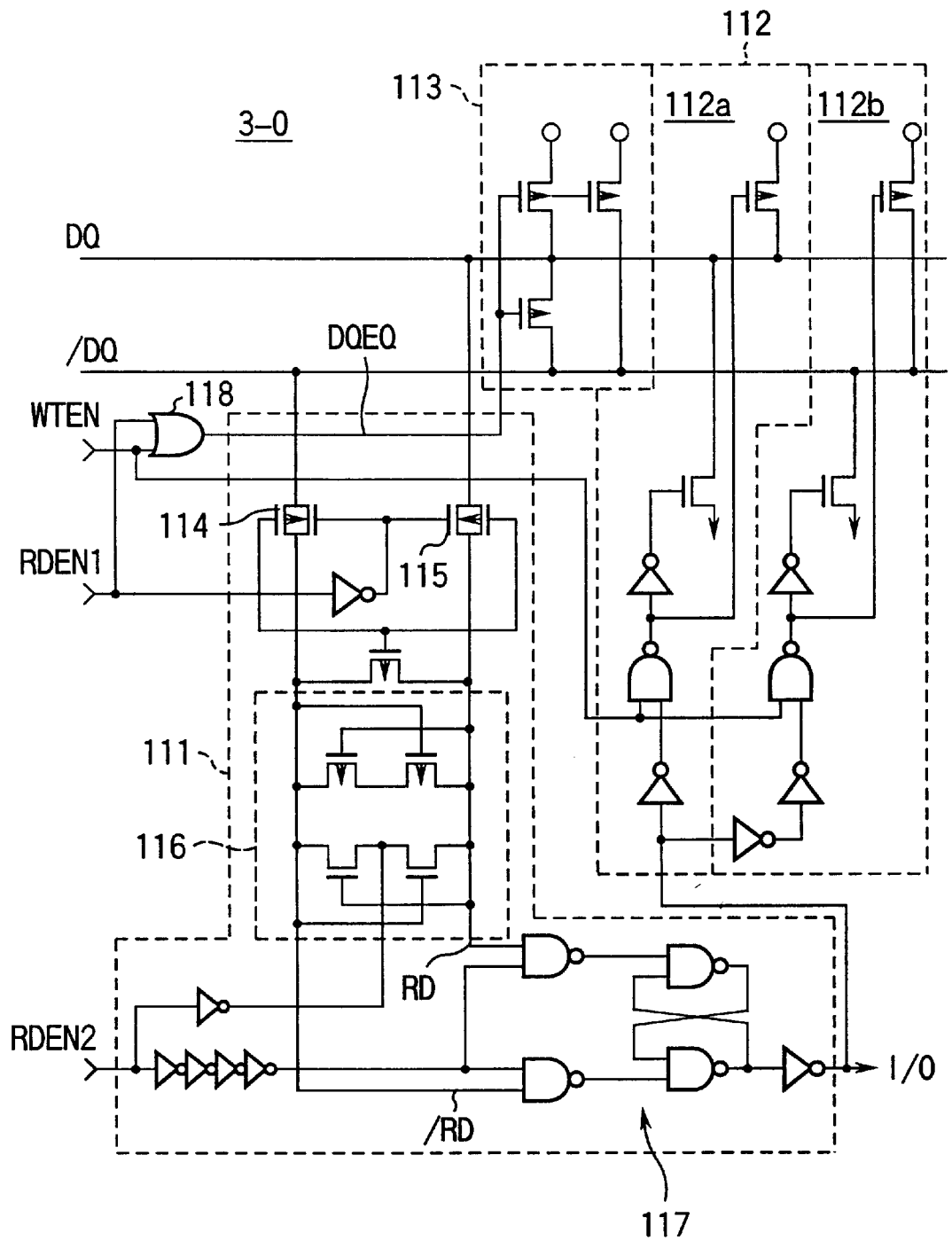
FIG. 12 is a circuit arrangement of the input/output data buffer.

FIG. 12 shows the arrangement of the input/output data buffers. All the input/output data buffers are identical in arrangement; thus, a description is given of the input/output data buffer 3-0. The input/output data buffer includes a read buffer 111, a write buffer 112, an equalizer 113 for a paired DQ line, etc. The read buffer 111 has transfer gates 114 and 115, a differential amplifier 116, and a latch circuit 117. The transfer gates 114 and 115 are connected to the paired DQ lines DQ and /DQ, respectively, and are controlled by the signal RDEN1 from the input/output data buffer control circuit 38 (see FIG. 3) in the control block 5. The differential amplifier 116 is connected to the transfer gates 114 and 115 to amplify a signal therefrom. The latch circuit 117 is responsive to the signal RDEN2 from the input/output data buffer control circuit 38 to latch an output signal of the differential amplifier 116 and then outputs it through an input/output terminal I/O.

The write buffer 112 has drive circuits 112a and 112b, which are responsive to the write buffer activation signal WTEN from the input/output data buffer control circuit 38 and data supplied through the input/output terminal I/O to drive the paired DQ lines DQ and /DQ in a complementary manner. The equalizer circuit 113 is responsive to an output of an OR circuit 118 which is supplied at its input terminals with the signals RDEN1 and WTEN to equalize the paired DQ lines DQ and /DQ.

Figure 13:
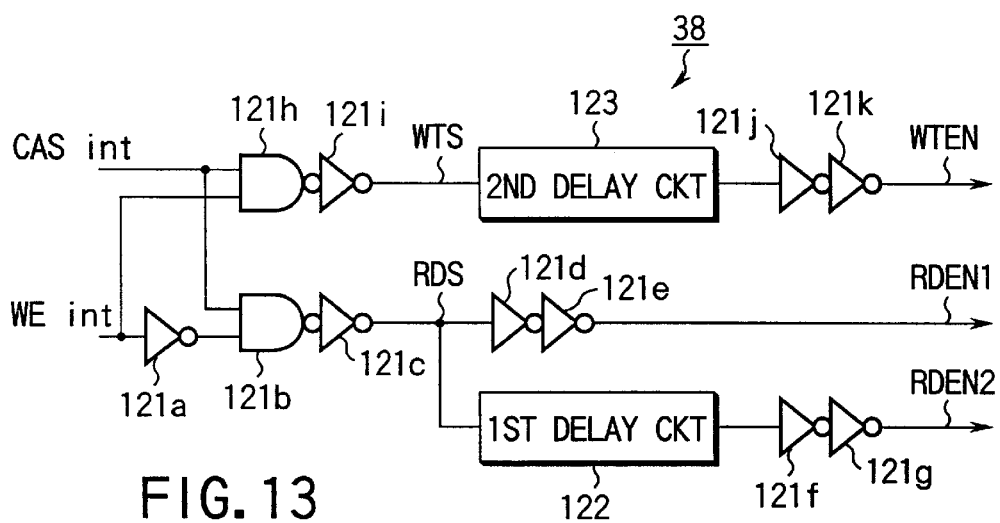
FIG. 13 shows an arrangement of the input/output data buffer control circuit.

FIG. 13 shows the arrangement of the input/output data buffer control circuit 38. This input/output data buffer control circuit, which is composed of inverters 121a, 121c, 121d, 121e, 121f, 121g, 121i, 121j, 121k, NAND circuits 121b, 121h, and first and second delay circuits 122 and 123, produces the signals WTEN, RDEN1 and RDEN2 in response to CASint and WEint. The delay circuits 122 and 123 are provided to adjust the timing of outputting the signals WTEN, RDEN1 and RDEN2. Heretofore, the delay time of each of those delay circuits was fixed to conform to the maximum storage capacity of the memory macro. In contrast, the present invention allows the delay time of each of the first and second delay circuits 122 and 123 to be varied according to the storage capacity of the memory macro.

The first delay circuit 122 receives the signal RDS from the inverter 121c to produce the signal RDEN2 which is delayed by a given time relative to the signal RDEN1. The second delay circuit 123 is responsive to a rising edge of an output signal WTS of the inverter 121i to produce the write buffer activation signal WTEN of a given pulse width.

Figure 14:
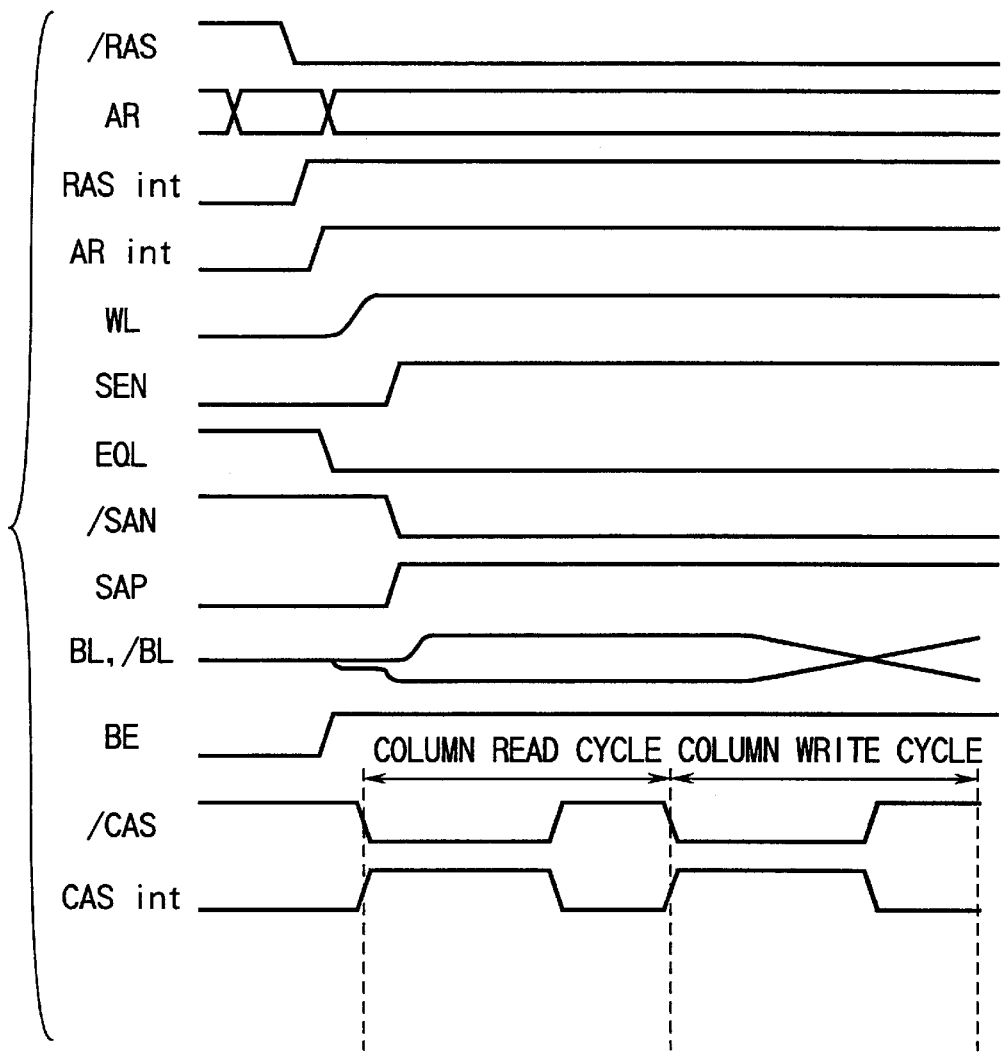
FIG. 14 is a timing diagram illustrating the operation of the DRAM macro.

The operation of the DRAM macro shown in FIGS. 2 through 13 will now be described with reference to FIGS. 14 and 15.

For example, to read data from a memory cell, the internal row address strobe signal RASint is first activated in response to a falling edge of the row address strobe signal /RAS, so that a row address AR is fed into the row address buffers shown in FIG. 3. After that, the internal row address ARint is activated and a selected word line WL then rises. A signal read from the memory cell onto the bit lines BL and /BL is amplified by the sense amplifier being activated by the signals SAP and /SAN.

In a column cycle, the first half indicates a read cycle for column address 1 and the second half indicates a write cycle for column address 2. In the read cycle, the internal column strobe signal CASint is first activated in synchronism with a falling edge of the column strobe signal /CAS as shown in FIGS. 14 and 15. The column address 1 and write enable signal /WE are fed into the buffers in response to the internal column strobe signal CASint to thereby activate internal column address signal AC0int to AC3int and deactivate the internal write enable signal WEint. The internal column address signal AC0int to AC3int is applied to the column decoder 87 shown in FIG. 10 to activate the column switch select signal CSW. In response to activation of the signals WEint and CASint, the signal RDS shown in FIG. 13 rises, activating the signal RDEN1 output from the input/output data buffer control circuit 38. When the signal RDEN1 is activated, the signal DQEQ shown in FIG. 12 goes to a high level, deactivating the DQ line equalizer circuit 113. Thus, the data from the sense amplifier begins to appear on the paired DQ lines DQ and /DQ. The first delay circuit 122 causes the signal RDEN2 to rise $\Delta t1$ after the signal RDS shown in FIG. 13 has risen. When the signal RDEN2 rises, the differential amplifier 116 shown in FIG. 12 is activated to amplify the data on the DQ lines DQ and /DQ and the amplified data is then latched in the latch circuit 117. The read buffer 111 includes the differential amplifier 116. For this reason, in order to prevent erroneous latch of data, it is required to wait for the signal RDEN2 to go high until the potential difference $\Delta V1$ between the paired bit lines DQ and /DQ usually becomes about 200 mV. The aforementioned time $\Delta t1$ is a delay time introduced to time the signal RDEN2 to meet such a requirement.

As the storage capacity of the DRAM macro increases, the length of the DQ lines increases in the column direction. For this reason, the delay time $\Delta t1$ required for the potential difference between the paired DQ lines to reach $\Delta V1$ increases as the memory macro increases in storage capacity. Thus, the present invention sets the delay time $\Delta t1$ variable according to the storage capacity of the memory macro.

Figure 15:
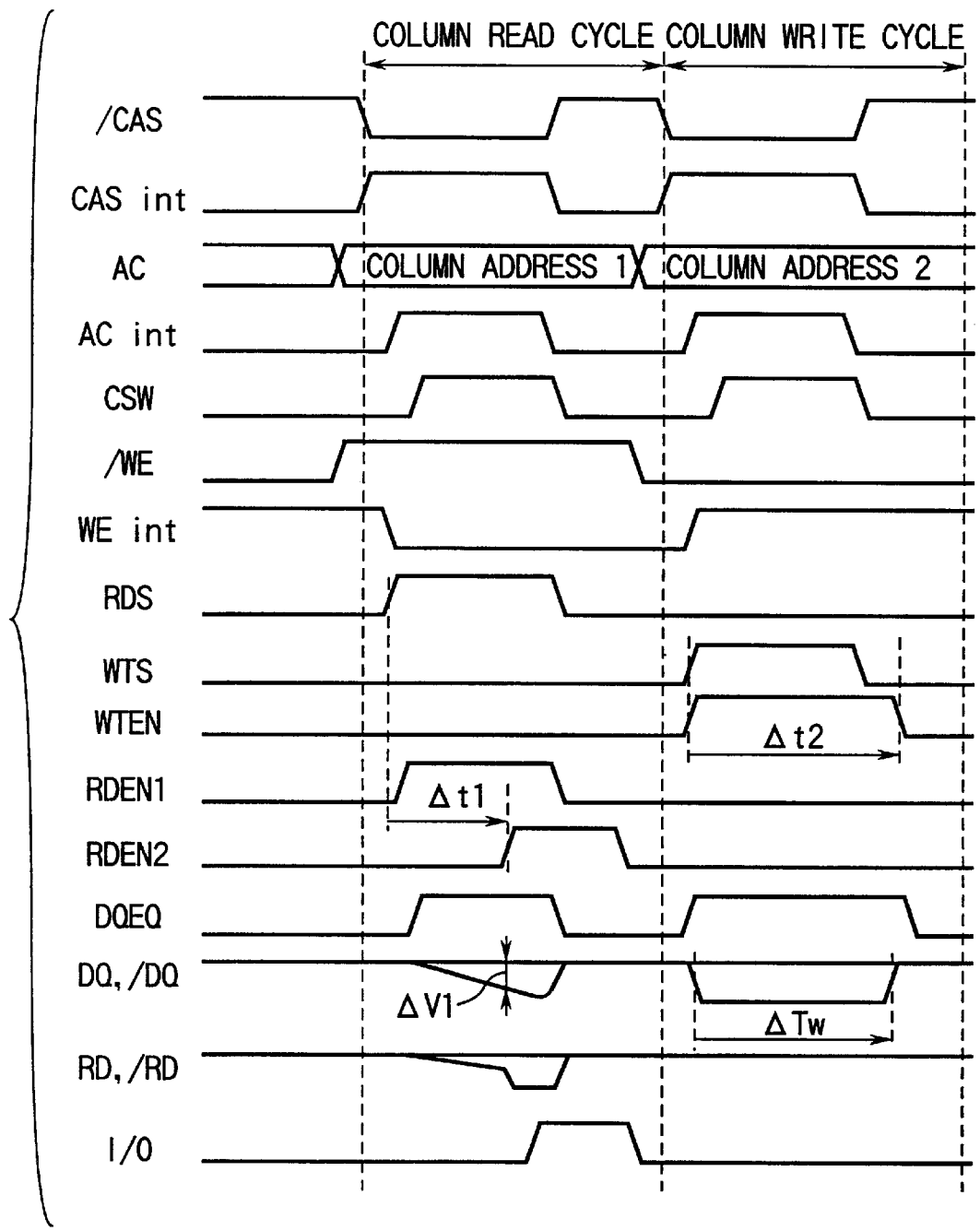
FIG. 15 is a timing diagram illustrating the operation of the DRAM macro.

In the write cycle shown in FIG. 15, when the write buffer activation signal WTEN is activated in response to the column strobe signal /CAS, write data is output onto the DQ lines DQ and /DQ by the write buffer 112 shown in FIG. 12. At this point, the pulse width $\Delta t2$ of the write buffer activation signal WTEN is determined so that the pulse duration $\Delta Tw$ of the write data on the DQ lines DQ and /DQ may become long enough to allow data to be written through the sense amplifier onto the bit lines. In the present invention, the pulse duration $\Delta t2$ is set variable according to the storage capacity of the macro.

[First Embodiment]

Figure 16A:
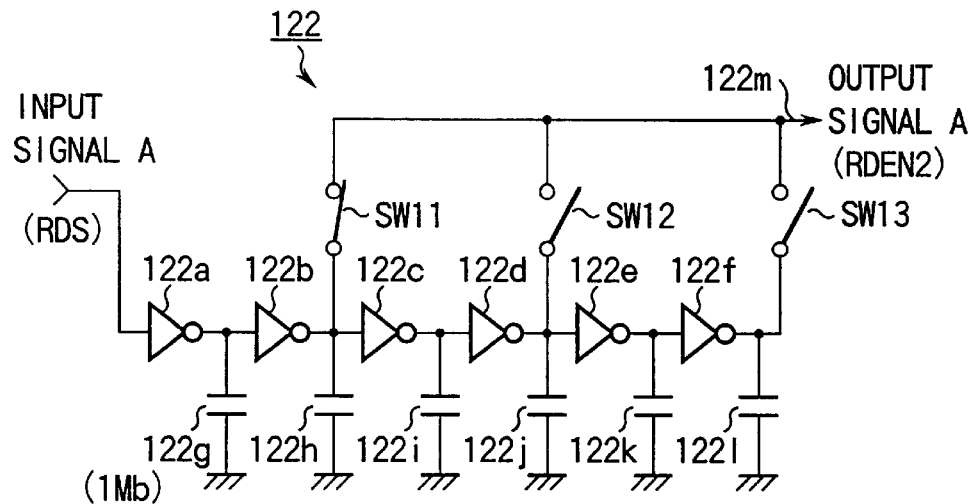
FIGS. 16A and 16B show a first embodiment of the present invention for the first delay circuit shown in FIG. 13.
Figure 16B:
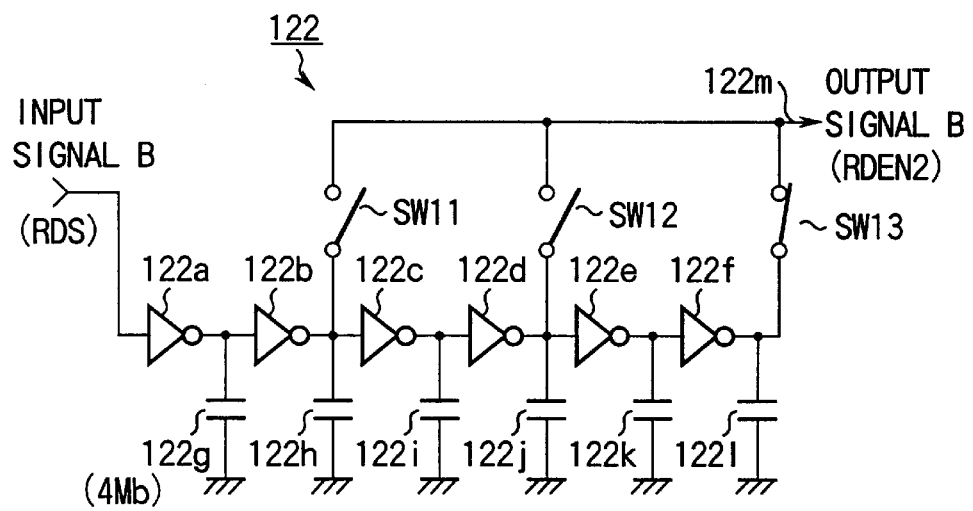

FIGS. 16A and 16B show a first embodiment of the present invention, particularly of the first delay circuit 122 shown in FIG. 13. In FIG. 16A, a plurality of inverters 122a to 122f are connected in cascade. The inverters 122a to 122f have their outputs connected to ground by capacitors 122g to 122l, respectively. A switch SW11 is connected between the output of the inverter 122b and an output node 122m. A switch SW12 is connected between the output of the inverter 122d and the output node 122m. A switch SW13 is connected between the output of the inverter 122f and the output node 122m.

With the first delay circuit 122 thus arranged, the delay time can be set according to the storage capacity of the memory macro by selectively turning on the switches SW11, SW12 and SW13. The switch connection of FIG. 16A corresponds to the case where the storage capacity of the memory macro is 1 Mbits. That is, the switch SW11 is turned on, while the other switches are turned off. On the other hand, FIG. 16B shows the case where the memory macro is 4 Mbits in storage capacity, in which case the switch SW13 is turned on, while the other switches are turned off.

FIG. 17 shows a relationship of the amount of delay involved in transmitting a signal from the input to the output node of the first delay circuit 122 between 1 Mbits and 4 Mbits of memory macro. The first delay circuit 122 can be set to introduce an amount of delay of either Ta or Tb (Tb>Ta) by selectively turning on the switches SW11, SW12 and SW13. As shown in FIGS. 18A and 18B, a rise of the signal RDEN can be timed to occur at the time Ta or Tb at which the potential difference between the paired DQ lines DQ and /DQ reaches ΔV1 according to whether the memory macro is 4 Mbits or 1 Mbits in storage capacity. Therefore, the data read operation can be speeded up because the amount of delay is not set unnecessarily long even in the case where the memory macro is small in storage capacity.

Figure 19A:
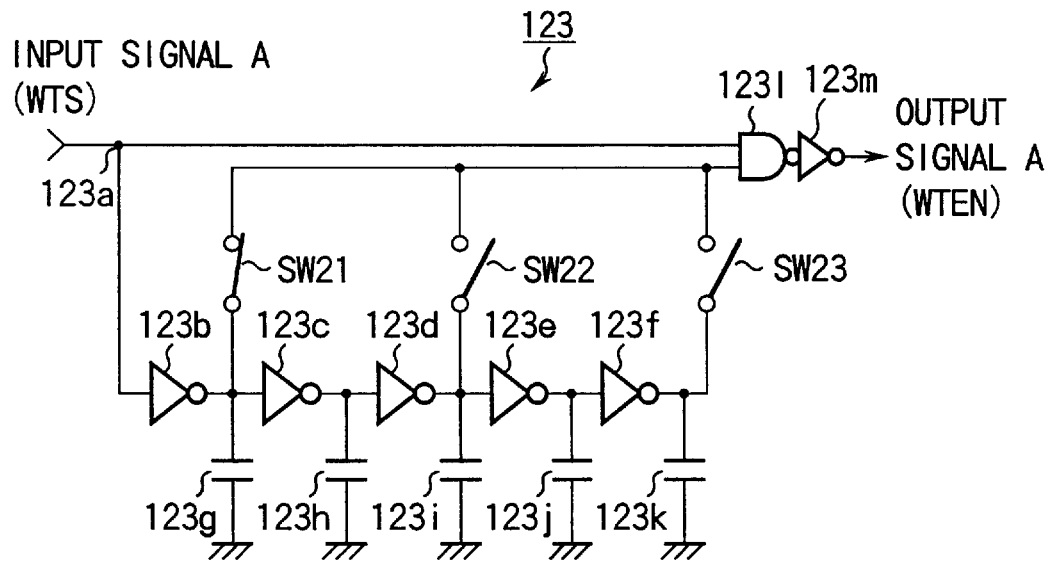
FIGS. 19A and 19B show the second delay circuit shown in FIG. 13 in the first embodiment of the present invention.
Figure 19B:
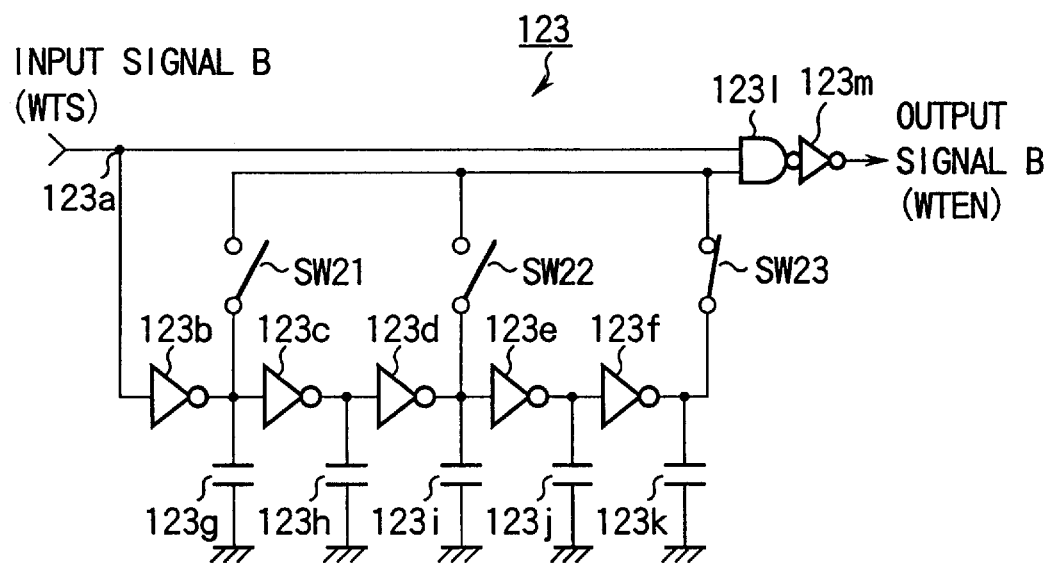

FIGS. 19A and 19B show the arrangement of the second delay circuit 123 shown in FIG. 13. In FIG. 19A, an input node 123a is connected to an input of a NAND circuit 123l. To the input node are cascade-connected a plurality of inverters 123b to 123f which have their outputs connected to ground by capacitors 123g to 123k, respectively. The outputs of the inverters 123b, 123d and 123f are connected to the other input of the NAND gate 123l by switches SW21, SW22 and SW23, respectively. The output of the NAND gate is connected to the input of an inverter 123m.

With the second delay circuit 123 thus arranged, the write buffer activation signal WTEN which has a pulse width dependent on the storage capacity of the memory macro can be produced by selectively turning on the switches SW21, SW22 and SW23. The switch connection of FIG. 19A corresponds to the case where the storage capacity of the memory macro is 1 Mbits, in which case, the switch SW21 is turned on, while the other switches are turned off. On the other hand, FIG. 19B shows the case where the memory macro is 4 Mbits in storage capacity, in which case the switch SW23 is turned on, while the other switches are turned off.

FIG. 20 shows a relationship of an input signal applied to the second delay circuit to resulting output signals A and B for 1 Mbits and 4 Mbits of memory macro. The second delay circuit 123 can set the pulse width of its output signal to either Tq or Tp (Tq>Tp) by selectively turning on the switches SW21, SW22 and SW23.

FIGS. 21A and 21B show operating waveforms at DQ line write time. In the case of FIG. 21A where the memory macro is 4 Mbits in storage capacity, the write pulse signal becomes more rounded than in FIG. 21B for 1 Mbits of storage capacity because in 4 Mbits the capacitance associated with the paired DQ lines is larger than in 1 Mbits.

The present invention sets the pulse width (duration) Tp of the write buffer activation signal WTEN for 4 Mbits longer than the pulse width Tq of that signal for 1 Mbits by selectively changing over the switches SW21, SW22 and SW23 of the second delay circuit 123. Thus, the same pulse width ΔTw can be attained for 1 Mbits and 4 Mbits. Further, there is no need of setting the pulse width longer than is necessary even in the case where the memory macro is small in storage capacity because the pulse width of the write buffer activation signal WTEN can be varied according to the storage capacity of the memory macro. For this reason, it is possible to reduce the write time.

As described previously, each of the switches SW11, SW12, SW13, SW21, SW22, and SW23 can be placed into a desired state by selectively forming a contact layer or a metal layer. Instead of the switches, fusible elements or storage elements such as nonvolatile memory can be used.

In forming a memory macro by combining memory array blocks, the first embodiment allows the signal delay times and pulse widths to be varied by changing over the switches of the first and second delay circuits 122 and 123 in accordance with the storage capacity of the memory macro. For this reason, the data read/write operation can be speeded up according to the storage capacity of the memory macro. Moreover, a memory macro merged with the logic unit can be designed in a short time because the amount of delay introduced by each of the first and second delay circuits 122 and 123 can be varied by merely changing over the switches.

[Second Embodiment]

Figure 22:
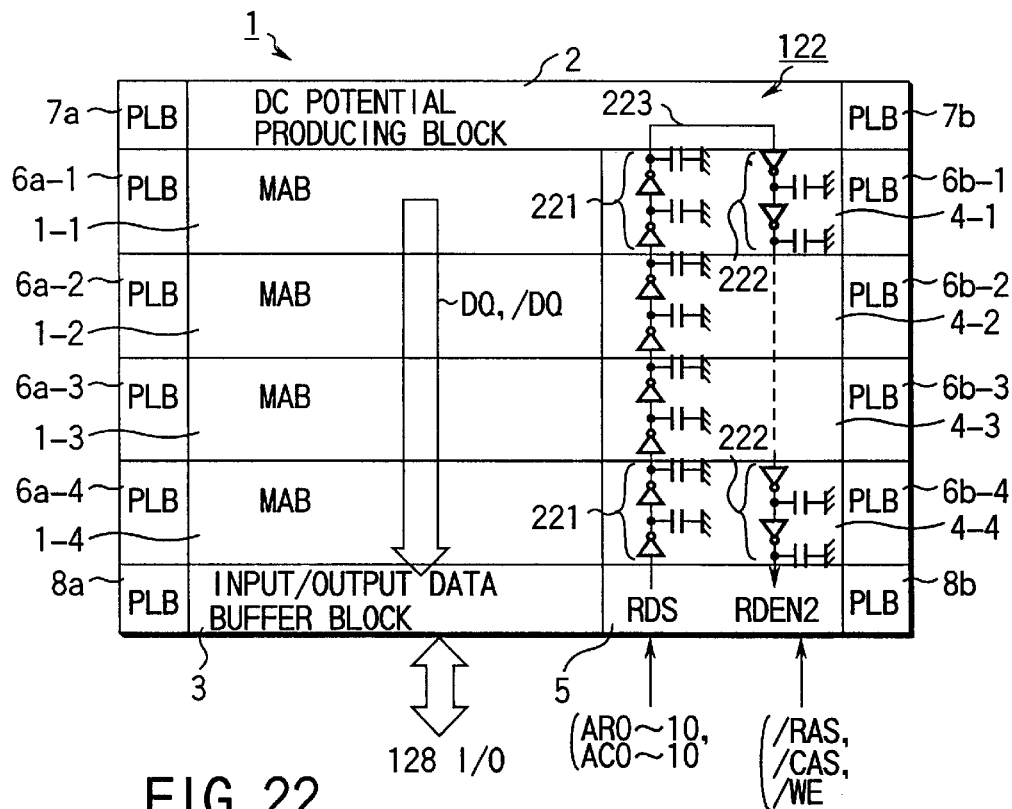
FIGS. 22 and 23 show a second embodiment of the present invention.
Figure 23:
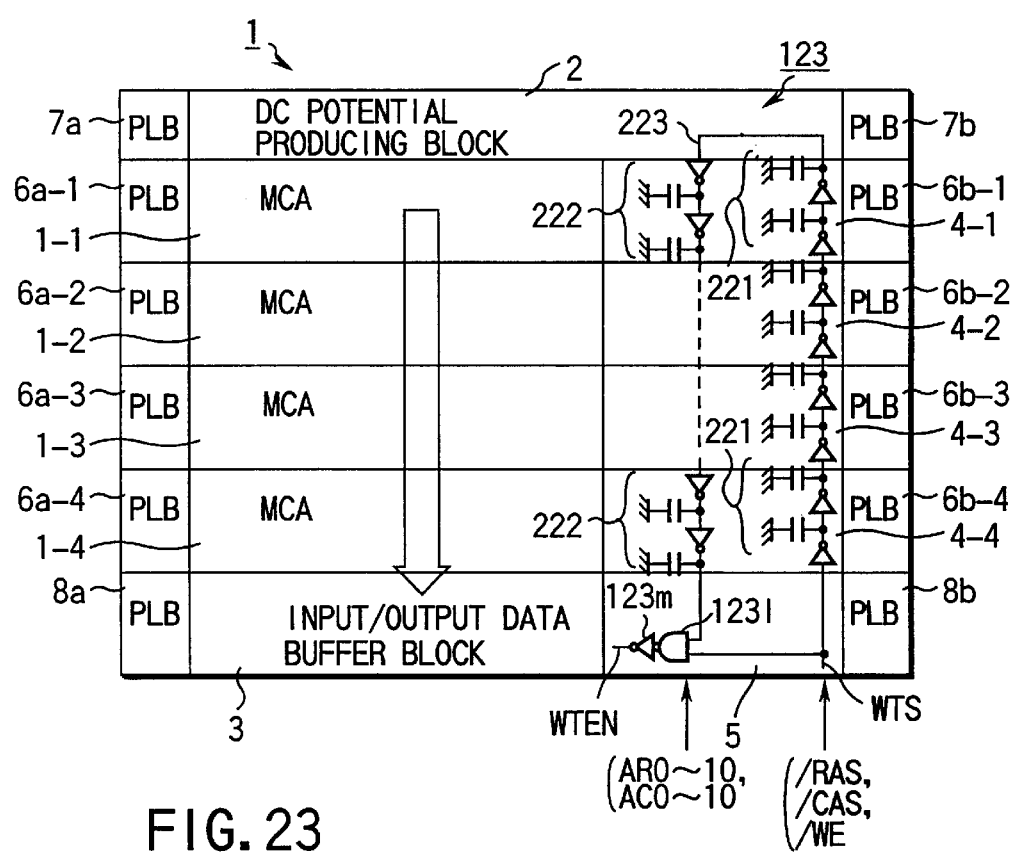

FIGS. 22 and 23 show a second embodiment of the present invention. In the first embodiment, the delay time introduced by each of the first and second delay circuits 122 and 123 in the input/output buffer control circuit 38 is set by selectively changing over the switches according to the storage capacity of the memory macro. In contrast, in the second embodiment, the delay time is controlled by changing the number of delay elements constituting each delay circuit according to the storage capacity of the memory macro.

FIG. 22 shows the first delay circuit 122 in the second embodiment. The first delay circuit 122, as described in conjunction with FIGS. 13 and 16, produces the signal RDEN2 in response to the signal RDS. In FIG. 22, inverters and capacitors that constitute the first delay circuit are provided in, for example, the memory array power driver blocks 4-1 to 4-4. That is, in the memory array power driver blocks 4-1 to 4-4, first delay circuit sections 221 each consisting of, for example, two inverters and two capacitors are provided on the go path and second delay circuit sections 222 each consisting of, for example, two inverters and two capacitors are provided on the return path. The first and second delay circuit sections 221 and 222 are automatically produced by CAD along with the memory array power driver blocks 4-1 to 4-4. When a predetermined number of memory array power driver blocks is produced according to the storage capacity of the memory macro, the first and second delay circuit sections 221 and 222 are automatically produced accordingly. The numbers of the inverters and capacitors are simply set according to a desired delay time.

In the DC potential producing block 2 there is provided an interconnection 223 that interconnects the first delay circuit sections 221 on the go path and the second delay circuit sections 222 on the return path. This interconnection is automatically produced by CAD together with the DC potential producing block 2. The first delay circuit 122, comprised of the first delay circuit sections 221, the interconnection 223, and the second delay circuit sections 222 thus produced, will provide a delay time corresponding to the storage capacity of the memory macro. Therefore, the signal RDS produced in the input/output data buffer control circuit 38 of the control block 5 is delayed by the time corresponding to the storage capacity of the memory macro in the first delay circuit 122 to become the signal RDEN2.

FIG. 23 shows the second delay circuit 123 in the second embodiment. In FIG. 23, like reference numerals are used to denote corresponding components to those in FIG. 22. The second delay circuit 123, as described in conjunction with FIGS. 13 and 19, produces the signal WTEN in response to the signal WTS. In FIG. 23, inverters and capacitors that constitute the second delay circuit are provided in, for example, the memory array power driver blocks 4-1 to 4-4. That is, in the memory array power driver blocks 4-1 to 4-4, first delay circuit sections 221 each consisting of, for example, two inverters and two capacitors are provided on the go path and second delay circuit sections 222 each consisting of, for example, two inverters and two capacitors are provided on the return path. The first and second delay circuit sections 221 and 222 are automatically produced by CAD along with the memory array power driver blocks 4-1 to 4-4. When a predetermined number of memory array power driver blocks is produced according to the storage capacity of the memory macro, the first and second delay circuit sections 221 and 222 are automatically produced accordingly. The numbers of the inverters and capacitors are simply set according to a desired delay time.

In the DC potential producing block 2 there is provided an interconnection 223 that interconnects the first delay circuit sections 221 on the go path and the second delay circuit sections 222 on the return path. This interconnection is automatically produced by CAD together with the DC potential producing block 2. The control block 5 is provided with the NAND circuit 1231 and the inverter 123m.

The second delay circuit 123, comprised of the first delay circuit sections 221, the interconnection 223, and the second delay circuit sections 222 thus produced, will provide a delay time corresponding to the storage capacity of the memory macro. Therefore, the signal WTS produced in the input/output data buffer control circuit 38 of the control block 5 is delayed by the time corresponding to the storage capacity of the memory macro in the second delay circuit 122 to become the signal WTEN.

In the second embodiment as well, as in the first embodiment, the data read/write operation can be speeded up because the delay time can be set according to the storage capacity of the memory macro.

Moreover, the first and second delay circuit sections 221 and 222 can be produced by CAD. The second embodiment is therefore easier in the design of memory macro than the first embodiment because there is no need of changing over the switches according to the storage capacity of the memory macro.

Furthermore, the memory array power driver blocks 4-1 to 4-4 can be made common to one another in arrangement because of provision of the first and second delay circuit sections 221 and 222, each consisting of two inverters and two capacitors, in each of the memory array power driver blocks and provision of the interconnection 223 that connects the series combination of the first delay circuit sections and the series combination of the second delay circuit sections in the DC potential producing block 2. Thus, the design of memory macro can be facilitated.

[Third Embodiment]

Figure 24:
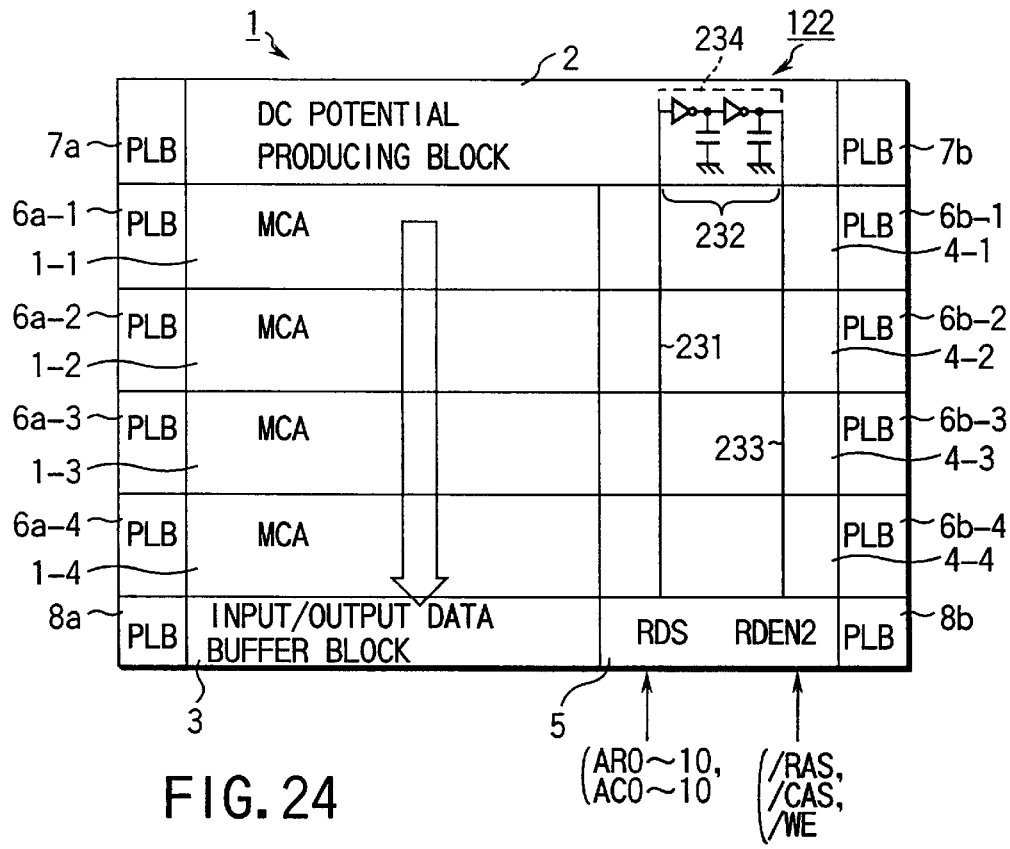
FIGS. 24 and 25 show a third embodiment of the present invention.
Figure 25:
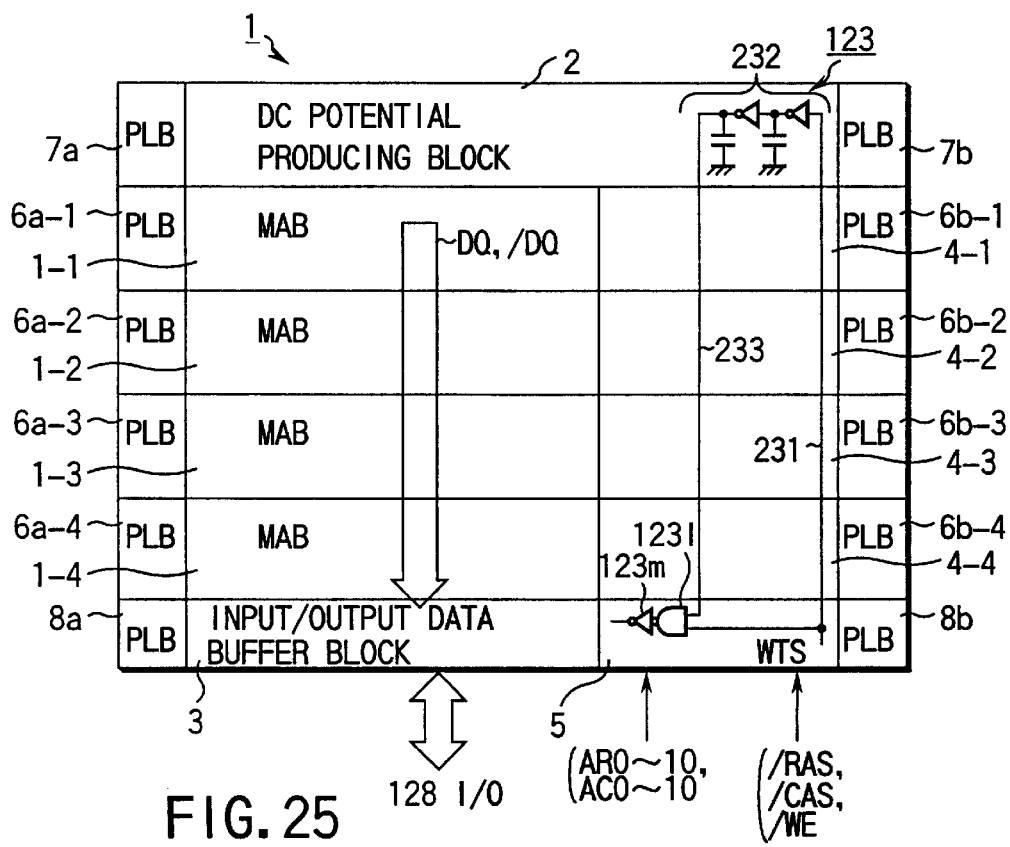

FIGS. 24 and 25 show a third embodiment of the present invention. In the third embodiment, the delay time introduced by each of the first and second delay circuits 122 and 123 is controlled by changing the interconnection length according to the memory macro storage capacity.

FIG. 24 shows the first delay circuit 122 in the third embodiment. The first delay circuit 122, as described in conjunction with FIGS. 13 and 16, produces the signal RDEN in response to the signal RDS. In FIG. 24, like reference numerals are used to denote corresponding components to those in FIG. 16. In FIG. 24, the signal RDS is applied over a first interconnection 231 to the input of a delay circuit 232, which comprises two inverters and two capacitors and is provided in the DC potential producing block 2. The output signal of the delay circuit 232 is applied to a second interconnection 233.

The first and second interconnections 231 and 233 are placed over the memory array power driver blocks 4-1 to 4-4 along the DQ lines. The first and second interconnections 231 and 233 are produced by CAD along with the memory array power driver blocks 4-1 to 4-4. Therefore, when a predetermined number of the memory array power driver blocks is produced according to the storage capacity of the memory array, the first and second interconnections 231 and 233 are produced automatically to suit the memory array capacity. The first and second interconnections are formed of the same layer and the same material as the DQ lines. For example, when the DQ lines are formed of the second level of aluminum, the first and second interconnections are also formed of the second level of aluminum.

The delay circuit 232 is produced along with the DC potential producing block 2 and connects the first and second interconnections 231 and 233 together. If a desired delay time can be set by the first and second interconnections, then the delay circuit may be omitted. In this case, the delay circuit 232 can be replaced by a third interconnection 234 that connects the first and second interconnections 231 and 234 as shown dashed in FIG. 24. This allows the circuit arrangement to be further simplified.

FIG. 25 shows the second delay circuit 123 in the third embodiment. In this figure, like reference numerals are used to denote corresponding components to those in FIGS. 13, 19, and 24. In FIG. 25, the signal WTS is applied to an input of the NAND circuit 1231 and to the input of the delay circuit 232 over the first interconnection 231. The delay circuit consists of two inverters and two capacitors and is placed in the DC potential producing block 2. The output signal of the delay circuit is applied to the other input of the NAND circuit 1231 over the second interconnection 233.

The first and second interconnections 231 and 233 are placed over the memory array power driver blocks 4-1 to 4-4 along the DQ lines. The first and second interconnections 231 and 233 are produced by CAD along with the memory array power driver blocks 4-1 to 4-4. Therefore, when a predetermined number of the memory array power driver blocks is produced according to the storage capacity of the memory array, the first and second interconnections 231 and 233 are produced automatically to suit the memory array capacity. The first and second interconnections are formed of the same layer and the same material as the DQ lines. For example, when the DQ lines are formed of the second level of aluminum, the first and second interconnections are also formed of the second level of aluminum.

The delay circuit 232 is produced along with the DC potential producing block 2 and connects the first and second interconnections 231 and 233 together. If a desired delay time can be set by the first and second interconnections, then the delay circuit may be omitted. In this case, the delay circuit 232 can be replaced by the third interconnection 234 as in the case of FIG. 24.

In the third embodiment as well, as in the first embodiment, the data read/write operation can be speeded up because the delay time is set according to the storage capacity of the memory macro. Moreover, the delay time can be set by the length of the first and second interconnections, which provides advantages that the circuit pattern can be simplified and the pattern area can be prevented from increasing.

[Fourth Embodiment]

Figure 26:
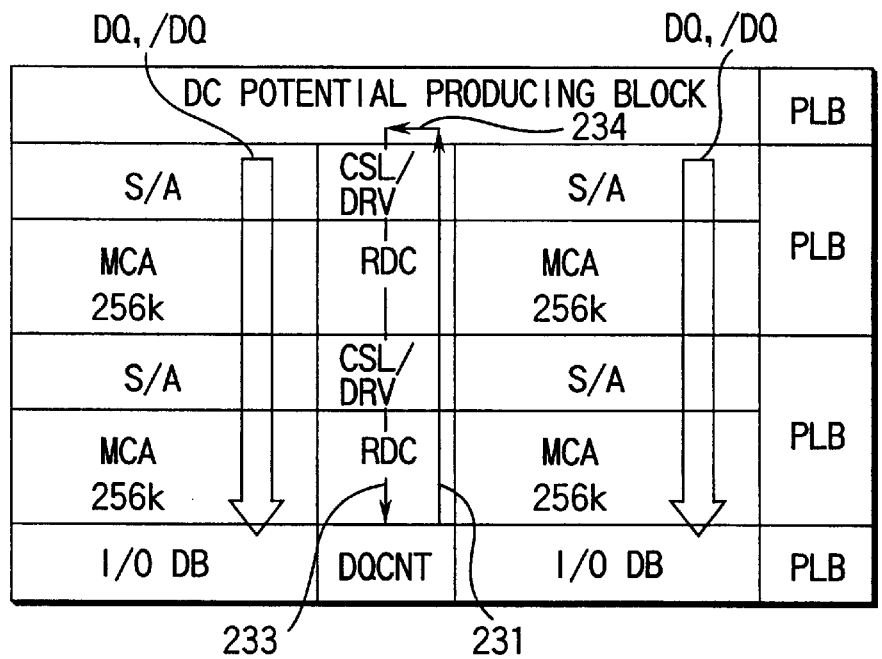
FIG. 26 shows a fourth embodiment of the present invention.

FIG. 26 shows a fourth embodiment of the present invention. In the third embodiment, the first and second interconnections 231 and 233 are formed on the memory array power driver blocks. In contrast, in this embodiment, the first and second interconnections 231 and 233 are placed on the drive circuits CSL/DRV that drive the row decoders RDC and the column select lines CSL. The third interconnection 234 that connects the first and second interconnections is placed on the DC potential producing block 2.

Such an arrangement allows the first and second interconnections to be placed away from the power lines, allowing the effects of noise to be suppressed.

Moreover, since only the first and second interconnections 231 and 233 are placed in the row decoders RDC and the drive circuits CSL/DRV and the third interconnection 234 is placed in the DC potential producing block 2. Therefore, the circuit pattern of the row decoders RDC and the drive circuits CSL/DRV can be simplified. Thus, the memory macro can be produced readily.

It is also possible to form the first, second and third interconnections 231, 233 and 234 from combined circuits of inverters and capacitors as shown in FIGS. 22 through 25.

[Fifth Embodiment]

Figure 27:
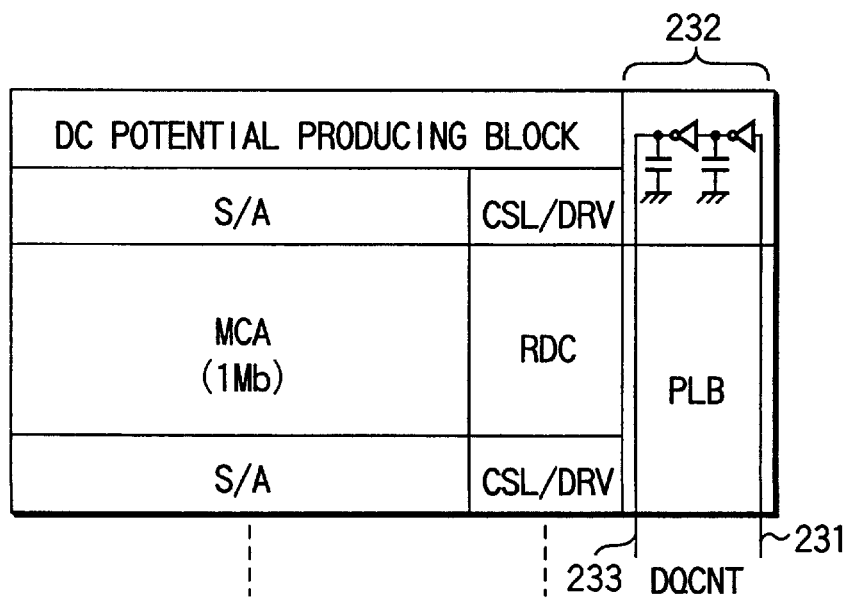
FIG. 27 shows a fifth embodiment of the present invention.

FIG. 27 shows a fifth embodiment of the present invention. In this embodiment, the first and second interconnections 231 and 233 are placed on the power line blocks PLB that comprise few circuit elements. For this reason, wiring is easy and the first and second interconnections are little affected by parasitic capacitances associated with other circuit elements, allowing the delay time to be set correctly.

[Sixth Embodiment]

Figure 28:
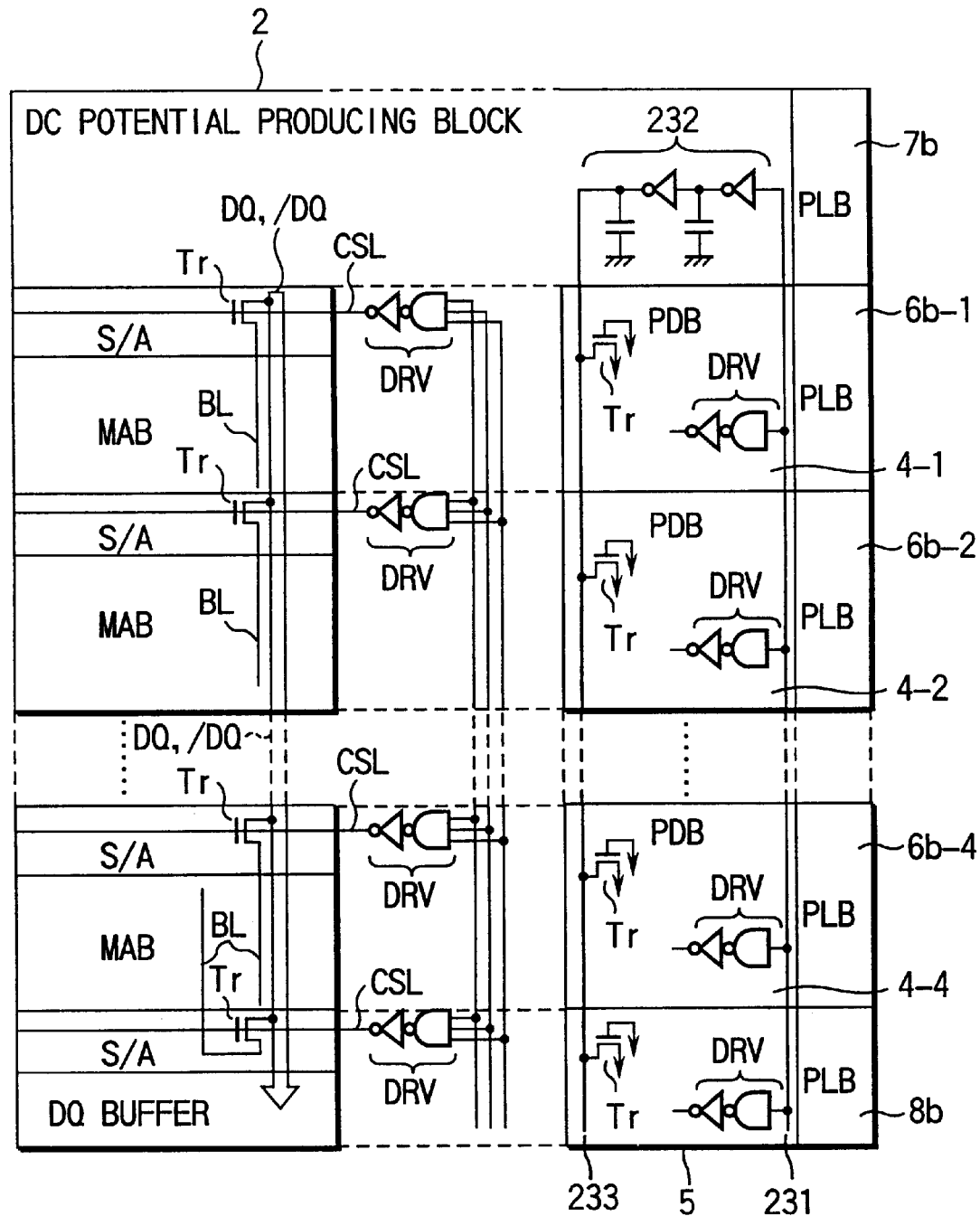
FIGS. 28, 29 and 30 show a sixth embodiment of the present invention.
Figure 29:
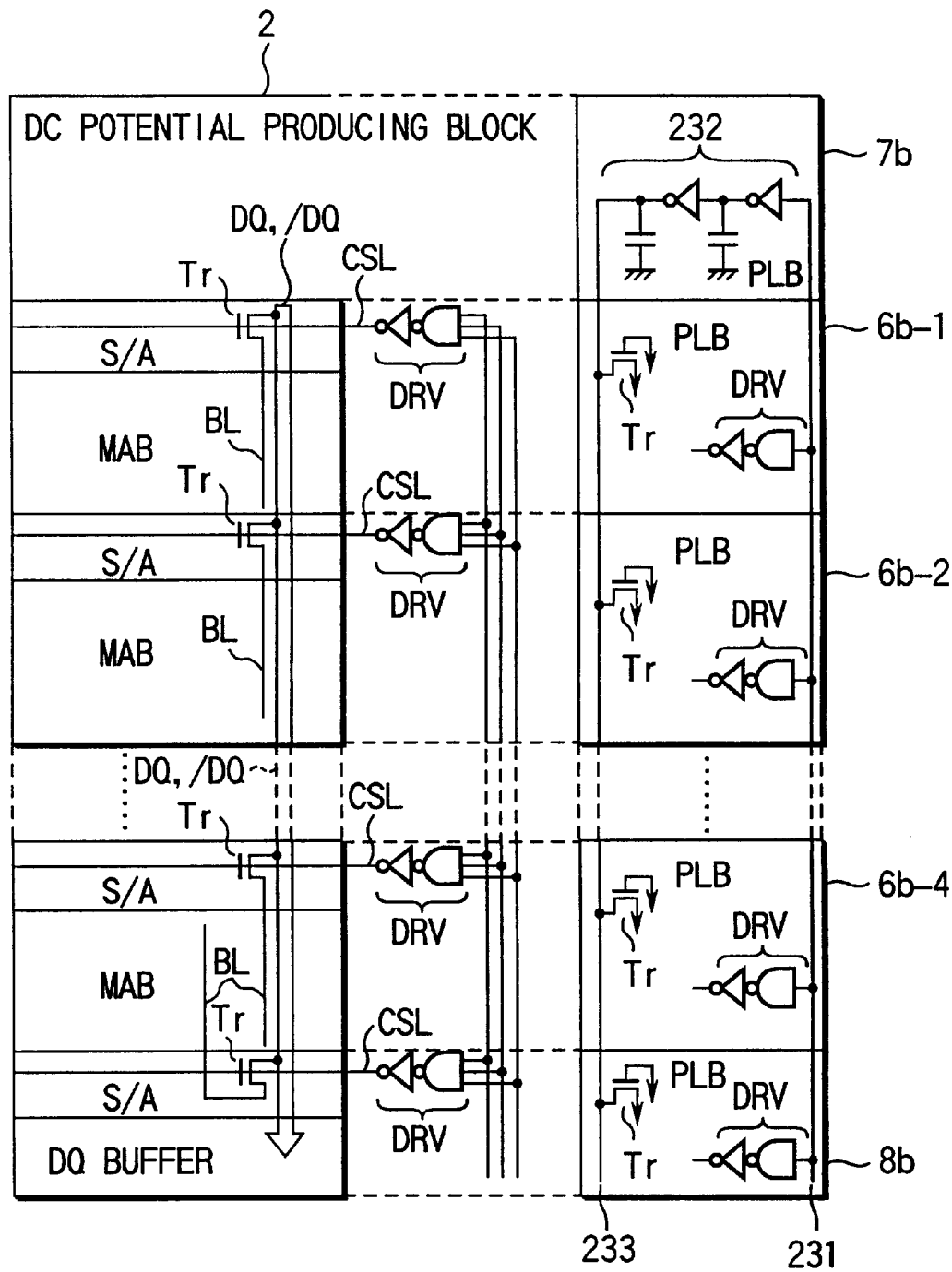
Figure 30:
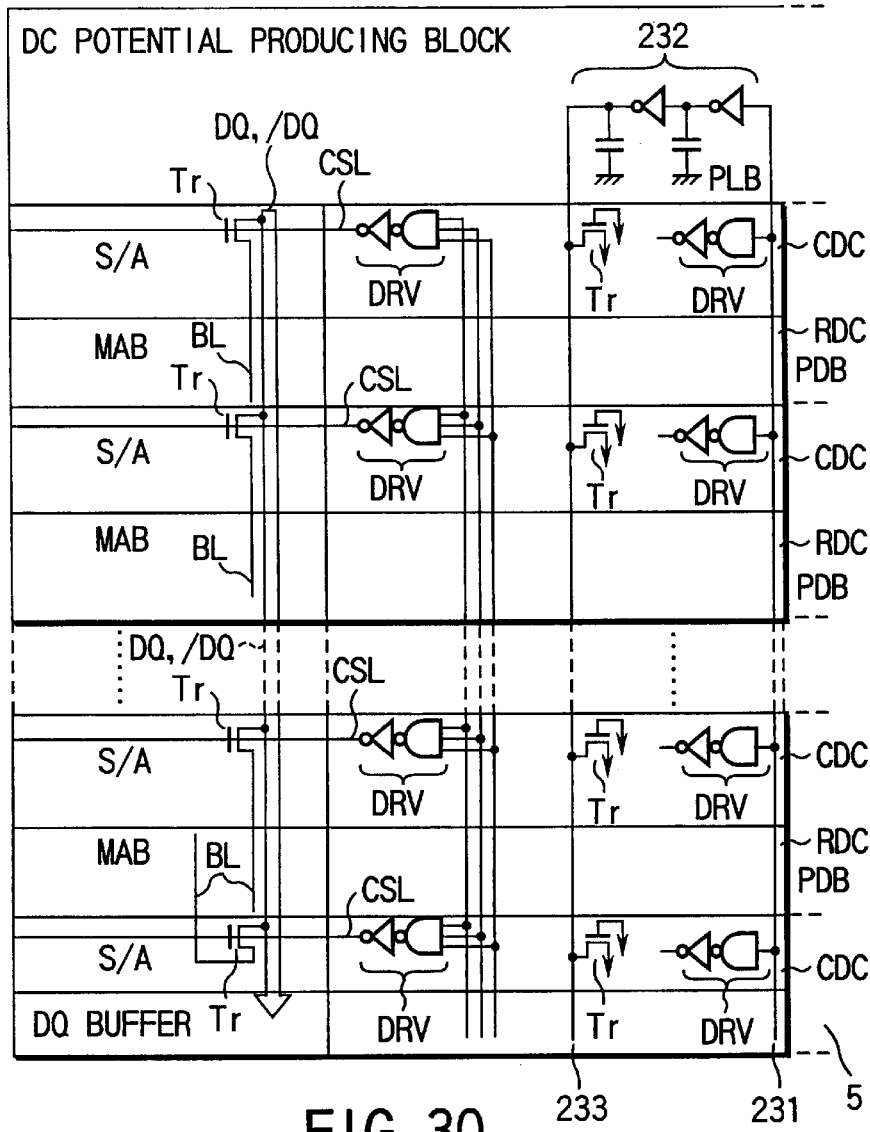

FIGS. 28, 29 and 30 shows a sixth embodiment of the present invention. In this embodiment, a dummy load similar to the load connected with each DQ line is connected to the first and second interconnections 231 and 233 in the third embodiment. That is, the DQ line is connected with transistors Tr serving as column select gates and having their respective gate connected to a column select line CSL that is connected to the output of a drive circuit DRV. The transistors Tr and the drive circuits DRV act as a load on the DQ line, causing a signal transmitted over that DQ line to be delayed. In this embodiment, therefore, a dummy load consisting of transistors Tr and drive circuits DRV like the load connected to each DQ line are connected to the first and second interconnections.

In FIG. 28, the first and second interconnections 231 and 233, the transistors Tr and the drive circuits DRV as the dummy load on the first and second interconnections are shown placed in the memory array power driver blocks 4-1 to 4-4 and the control block 5. The first and second interconnections 231 and 233, the transistors Tr and the drive circuits DRV are automatically produced by CAD along with the memory array power driver blocks 4-1 to 4-4 and the control block 5. The delay circuit 232 that connects the first and second interconnections 231 and 233 is placed in the DC potential producing block 2 and automatically produced by CAD together with the block 2.

FIG. 29 shows an example in which the first and second interconnections 231 and 233, the transistors Tr and the drive circuits DRV as the dummy load on the first and second interconnections are placed in the power line blocks 6b-1 to 6b-4 and 8b and the delay circuit 232 that connects the first and second interconnections 231 and 233 is placed in the power line block 7b. The first and second interconnections 231 and 233, the transistors Tr and the drive circuits DRV are automatically produced by CAD along with the power line blocks 6b-1 to 6b-4 and 8b. The delay circuit 232 is automatically produced by CAD together with the power line block 7b.

FIG. 30 shows an example in which the first and second interconnections 231 and 233 are placed in the column decoders CDC and the row decoders RDC, the transistors Tr and the drive circuits DRV are placed in the column decoders CDC in which the drive circuits DRV connected with the column select lines are placed, and the delay circuit 232 that connects the first and second interconnections 231 and 233 is placed in the DC potential producing block 2. The first and second interconnections 231 and 233 placed in the row decoders RDC are automatically produced by CAD along with the row decoders. The first and second interconnections 231 and 233, the transistors Tr and the drive circuits DRV which are placed in the column decoders CDC are produced by CAD together with the column decoders. Likewise, the delay circuit 232 is automatically produced by CAD together with the DC potential producing block 2.

In the sixth embodiment, the first and second interconnections 231 and 233 are connected with loads similar to the loads connected to the DQ lines, making it easy to set the first and second interconnections to provide the same delay time as the DQ lines.

In the example of FIG. 28, the first and second interconnections 231 and 233, the transistors Tr and the drive circuits DRV are placed in the memory array power driver blocks 4-1 to 4-4 adjacent to the control block 5. Therefore, the distance between the first and second interconnections and the control block can be minimized, preventing the interconnections from making a long circuit. For this reason, the effects of parasitic capacitances associated with other circuit elements can be minimized and the delay time can be set accurately.

In the example of FIG. 29, the first and second interconnections 231 and 233, the transistors Tr and the drive circuits DRV are placed in the power line blocks 6b-1 to 6b-4 and 8b which have few circuit elements. For this reason, the effects of parasitic capacitances associated with other circuit elements can be minimized and the delay time can be set accurately.

In the example of FIG. 30, the first and second interconnections 231 and 233, the transistors Tr and the drive circuits DRV are placed in the column decoders CDC. For this reason, the transistors Tr and the drive circuits DRV placed in regions of column decoders CDC and sense amplifiers can be operated under the same conditions, allowing the delay time to be set accurately.

In the second through the sixth embodiment, the places of the first and second interconnections and the first and second delay circuits are not limited to those described. They may be placed in any portions that can be produced automatically by CAD.

A memory macro merged with a logic unit in a semiconductor device has a clear and specific use. Thus, a memory macro having storage capacity of 16 Mbits would not be used in a semiconductor device that needs to have storage capacity of 10 Mbits. Any memory macro to be merged with a logic circuit in a semiconductor device needs to have storage capacity that the semiconductor device requires. In the present invention, the timing of transmitting signals can be easily changed in accordance with the storage capacity of the memory macro. The invention can therefore enhance the performance of a memory macro which has a small storage capacity and which is merged with a logic circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory macro section having at least one memory array block in which a plurality of memory cells are arranged in rows and columns;
   a data buffer block for holding input/output data;
   paired data lines connected between the memory array block and the data buffer block for transferring a signal between a selected memory cell and the data buffer block;
   a latch circuit provided in the data buffer block for latching the signal on the paired data lines; and
   a timing adjust circuit, coupled to the latch circuit, for adjusting the timing of activating the latch circuit according to the storage capacity of the memory macro.

2. A device according to claim 1, wherein the timing adjust circuit has a delay element having its delay time set variable according to the storage capacity of the memory macro.

3. A device according to claim 1, wherein the timing adjust circuit has a plurality of delay elements and switches for selectively outputting output signals of the respective delay elements.

4. A device according to claim 3, wherein the switches are formed of interconnection layers, the interconnection layers being selectively disconnected according to the storage capacity of the memory macro.

5. A device according to claim 3, wherein the switches are formed of different levels of interconnection layers, the interconnection layers being selectively connected by contacts.

6. A device according to claim 1, wherein the timing adjust circuit is formed of interconnections, the length of the interconnections being set according to the storage capacity of the memory macro.

7. A device according to claim 6, wherein the memory array block includes a row decoder and a column select line driver, and the interconnections are placed in the row decoder and the column select line driver.

8. A device according to claim 6, wherein the memory macro section includes a power line block provided with power lines, and the interconnections are placed in the power line block.

9. A device according to claim 6, wherein the memory array block includes column select gates for connecting column select gates and bit lines and column select line drivers for driving column select lines connected to the column select gates, and the interconnections are connected with the column select gates and the column select line drivers included in the memory array block.

10. A device according to claim 6, wherein the interconnections are formed of a same layer and a same material as the paired data lines.

11. A device according to claim 6, wherein the memory array block comprises a column select gate connecting a column select line and a bit select line, the interconnection being connected to the column select gate included in the memory array block.

12. A device according to claim 11, wherein the memory macro section comprises a power line block provided with a power line, and the column select gate connected to the interconnections are provided on the power line block.

13. A device according to claim 11, wherein the memory macro section comprises a column decoder, and the column select gate connected to the interconnections are provided on the column decoder.

14. A device according to claim 6, wherein the memory array block comprises a column select line driver for driving a column select line and the interconnections are connected to the column select line driver included in the memory array block.

15. A device according to claim 14, wherein the memory macro section comprises a power line block, and the column select line driver connected to the interconnections are provided on the power line block.

16. A device according to claim 14, wherein the memory macro section comprises a column decoder, and the column select line driver connected to the interconnections are provided on the column decoder.

17. A device according to claim 1, further comprising a logical circuit unit which is merged with the memory macro section.

18. A device according to claim 1, wherein the timing adjust circuit is formed of a wiring, the length of the wiring being set according to the storage capacity of the memory macro.

19. A device according to claim 18, wherein the wiring is formed of a same layer and a same material as the paired data lines.

20. A semiconductor memory device comprising:
   a memory macro section having at least one memory array block in which a plurality of memory cells are arranged in rows and columns;
   a data buffer block for holding input/output data;
   paired data lines connected between the memory array block and the data buffer block for transferring a signal between a selected memory cell and the data buffer block;
   a data write circuit, coupled to the paired data lines, for supplying a write signal to the paired data lines; and
   a timing adjust circuit, coupled to the data write circuit, for adjusting the pulse width of the write signal from the data write circuit according to the storage capacity of the memory macro.

21. A device according to claim 20, wherein the timing adjust circuit has a delay element having its delay time set variable according to the storage capacity of the memory macro.

22. A device according to claim 20, wherein the timing adjust circuit has a plurality of delay elements and switches for selectively outputting output signals of the respective delay elements.

23. A device according to claim 22, wherein the switches are formed of interconnection layers, the interconnection layers being selectively disconnected according to the storage capacity of the memory macro.

24. A device according to claim 22, wherein the switches are formed of different levels of interconnection layers, the interconnection layers being selectively connected by contacts.

25. A device according to claim 20, wherein the timing adjust circuit is formed of interconnections, the length of the interconnections being set according to the storage capacity of the memory macro.

26. A device according to claim 25, wherein the memory array block includes a row decoder and a column select line driver, and the interconnections are placed in the row decoder and the column select line driver.

27. A device according to claim 25, wherein the memory macro section includes a power line block provided with power lines, and the interconnections are placed in the power line block.

28. A device according to claim 25, wherein the memory array block includes column select gates for connecting column select gates and bit lines and column select line drivers for driving column select lines connected to the column select gates, and the interconnections are connected with the column select gates and the column select line drivers included in the memory array block.

29. A device according to claim 25, wherein the interconnections are formed of a same layer and a same material as the paired data lines.

30. A device according to claim 20, further comprising a logical circuit unit which is merged with the memory macro section.

31. A semiconductor memory device comprising:
one or more memory array blocks in which a plurality of memory cells are arranged in rows and columns;
a data buffer block for holding input/output data;
paired data lines connected between the memory array block and the data buffer block for transferring a signal between a selected memory cell and the data buffer block;
a latch circuit provided in the data buffer block for latching the signal on the paired lines;
one or more power blocks the number of which substantially corresponding to that of the memory array blocks, the power blocks supplying power to the memory array blocks; and
timing adjust circuits, coupled to the latch circuit and provided in the power blocks and interconnected for adjusting the timing of activating the latch circuit according to the number of the memory array blocks.

32. A device according to claim 31, wherein the timing adjust circuits each includes a plurality of delay elements.

33. A device according to claim 31, wherein the timing adjust circuits are formed of interconnections.

34. A semiconductor memory device comprising:
at least one memory cell array block in which a plurality of memory cells are arranged in rows and columns;
a sense amplifier block for detecting data read from the memory cells in the memory cell array block;
a column select block placed to correspond to the sense amplifier block for making a selection from the columns;
a row select block placed to correspond to the memory cell array block for making a selection from the rows;
a data buffer block for holding input/output data;
paired data lines connected between the sense amplifier block and the data buffer block for transferring a signal between a selected sense amplifier and the data buffer block;
a latch circuit provided in the data buffer block for latching signals on the paired data lines; and
timing adjust circuits, coupled to the latch circuit and provided in the column select block and the row select block and interconnected for adjusting the timing of activating the latch circuit according to the number of the memory array blocks.

35. A device according to claim 34, wherein the timing adjust circuits each includes a plurality of delay elements.

36. A device according to claim 34, wherein the timing adjust circuits are formed of interconnections.

37. A semiconductor memory device comprising:
at least one memory cell array block in which a plurality of memory cells are arranged in rows and columns;
a sense amplifier block for detecting data read from the memory cells in the memory cell array block;
a column select block placed to correspond to the sense amplifier block for making a selection from the columns;
a data buffer block for holding input/output data;
paired data lines connected between the sense amplifier block and the data buffer block for transferring a signal between a selected sense amplifier and the data buffer block; and
a timing adjust circuit, coupled to the data buffer block and provided to correspond to the memory array block and including a delay element that provides the same delay time as the column select circuit so that the delay of a signal passing through the delay element and the delay of a signal transferred over the paired data lines match.

38. A device according to claim 37, further comprising power blocks, substantially corresponding in number to the memory array blocks, for supplying power to the memory array block, and wherein the delay element is provided in each of the power blocks.

39. A device according to claim 37, further comprising column select blocks substantially corresponding in number to the memory array blocks and including column select circuits, and wherein the delay element is provided in each of the column select blocks.

40. A device according to claim 37, wherein the delay element is formed of the same circuit as the column select circuit.

* * * * *

UNITED STATES PATENT AND TRADEMARK OFFICE
CERTIFICATE OF CORRECTION

PATENT NO. : 6,154,396
DATED : November 28, 2000
INVENTOR(S) : Tomoaki YABE, et al.

It is certified that error appears in the above-identified patent and that said Letters Patent is hereby corrected as shown below:

On the cover page, left column, between [22] and [51], the following has been inserted:

--Foreign Application Priority Data

Nov. 20, 1998   [JP]   Japan ........ 10-330802--.

In Claim 11, column 17, line 57, "interconnection" has been deleted and in its place --interconnections-- has been inserted.

Signed and Sealed this

Twenty-second Day of May, 2001

Attest:

NICHOLAS P. GODICI

*Attesting Officer*    *Acting Director of the United States Patent and Trademark Office*